United States Patent
Udagawa et al.

(10) Patent No.: US 7,333,780 B2
(45) Date of Patent: Feb. 19, 2008

(54) POLAR MODULATION TRANSMISSION APPARATUS AND RADIO COMMUNICATION APPARATUS

(75) Inventors: Masaharu Udagawa, Setagaya-ku (JP); Taichi Ikedo, Yokohama (JP)

(73) Assignee: Matsushita Electric Industrial Co., Ltd., Osaka (JP)

( * ) Notice: Subject to any disclaimer, the term of this patent is extended or adjusted under 35 U.S.C. 154(b) by 526 days.

(21) Appl. No.: 11/069,051

(22) Filed: Mar. 2, 2005

(65) Prior Publication Data

US 2005/0245208 A1    Nov. 3, 2005

(30) Foreign Application Priority Data

Mar. 3, 2004    (JP) ............................. 2004-059500

(51) Int. Cl.
  H04B 1/04    (2006.01)
  H04B 1/02    (2006.01)
  H04B 1/66    (2006.01)

(52) U.S. Cl. ...................... 455/126; 455/102; 455/108; 455/110; 375/300; 375/302; 330/295

(58) Field of Classification Search ............... 455/108, 455/102, 110–113, 126, 127.1–127.5, 109, 455/114.3, 116, 91, 115.1; 330/10, 107, 330/136, 149, 297, 295, 251, 207; 375/295, 375/297, 308, 300, 302, 376, 296, 278; 332/162
See application file for complete search history.

(56) References Cited

U.S. PATENT DOCUMENTS

| 6,366,177 | B1 | 4/2002 | McCune et al. | |
| 6,377,784 | B2 | 4/2002 | McCune | |
| 6,987,417 | B2 * | 1/2006 | Winter et al. | 330/10 |
| 6,998,914 | B2 * | 2/2006 | Robinson | 330/124 R |
| 7,072,626 | B2 * | 7/2006 | Hadjichristos | 455/126 |
| 2005/0074073 | A1 * | 4/2005 | Yuan et al. | 375/268 |
| 2006/0291589 | A1 * | 12/2006 | Eliezer et al. | 375/302 |
| 2007/0037530 | A1 * | 2/2007 | Peckham et al. | 455/102 |
| 2007/0189431 | A1 * | 8/2007 | Waheed et al. | 375/376 |

FOREIGN PATENT DOCUMENTS

| JP | 654877 | 5/1991 |
| JP | 2002530992 | 9/2002 |
| WO | 0031881 | 6/2000 |

\* cited by examiner

Primary Examiner—Pablo N. Tran
(74) Attorney, Agent, or Firm—Stevens, Davis, Miller & Mosher, LLP

(57) ABSTRACT

A polar modulation transmission apparatus is provided which can adjust synchronization between an amplitude signal and phase signal in a simple configuration accurately and automatically. A polar signal generation circuit 101 sends an amplitude signal and phase signal for synchronization adjustment to transmission lines of these signals, incorporates the amplitude signal and phase signal for synchronization adjustment output from low pass filters 104, 132 which are final stage circuits that process the respective signals in their baseband signal states into a delay difference detection circuit 109, a synchronization adjustment control circuit 110 obtains a synchronization adjustment value at which the delay difference between the signals is eliminated based on the delay difference detection result and a synchronization adjustment circuit 102 gives delays corresponding to the synchronization adjustment value to the respective signals.

11 Claims, 19 Drawing Sheets

POLAR MODULATION TRANSMISSION APPARATUS AND RADIO COMMUNICATION APPARATUS

BACKGROUND OF THE INVENTION

1. Field of the Invention

The present invention relates to a radio transmission apparatus and radio communication apparatus using polar modulation.

2. Description of the Related Art

FIG. 1 shows a first conventional example of a polar modulation transmitter. A polar modulation transmitter is provided with a polar signal generation circuit 1201, an amplitude control circuit 1202, a phase modulated signal generation circuit 1203 and a non-linear power amplifier 1204. In such a polar modulation transmitter, the polar signal generation circuit 1201 generates a signal corresponding to the amplitude and phase of a transmit modulated signal from an input signal and based on this, the amplitude control circuit 1202 and phase modulated signal generation circuit 1203 generate an amplitude signal and a phase modulated signal respectively. The non-linear power amplifier 1204, which is operating in a non-linear saturation mode, receives the phase modulated signal and carries out amplitude modulation by changing a supply voltage according to the amplitude signal. Thus, operating the non-linear power amplifier 1204 in a non-linear saturation mode can reduce current consumption compared to a case where a linear power amplifier is used and thereby extend a battery life of a battery-operated transmitter (e.g., see Specification of U.S. Pat. No. 6,377,784B2).

FIG. 2 illustrates a second conventional example of a polar modulation transmitter. In addition to a polar signal generation circuit 1301, a timing adjustment circuit 1302, an amplitude control circuit 1305, a phase modulated signal generation circuit 1306 and a power amplifier 1307, this polar modulation transmitter is further provided with an amplitude signal detection circuit 1308, a phase signal detection circuit 1309 and a PA calibration table 1310. By correcting the amplitude control circuit 1305 and phase modulated signal generation circuit 1306 using this calibration table 1310, it is possible to correct amplitude-amplitude distortion (AM-AM distortion) and amplitude-phase distortion (AM-PM distortion) of the power amplifier 1307. Furthermore, the timing adjustment circuit 1302 adjusts timings of an amplitude signal and a phase signal, corrects a delay difference between the amplitude signal and phase signal in their respective paths, and can thereby suppress deterioration of transmission quality due to the delay difference (e.g., see Specification of U.S. Pat. No. 6,366,177B1). For example, according to a W-CDMA standard, transmission quality is expressed by ACLR (Adjacent Channel Leakage Power Ratio) and EVM (Error Vector Magnitude (modulation accuracy)).

FIG. 3 illustrates a third conventional example of a polar modulation transmitter. This polar modulation transmitter includes a modulator section 1410 with delay circuits 1412, 1413 added thereto. It is possible to suppress deterioration of ACLR and EVM due to a delay difference between the amplitude signal and phase signal by adjusting timings of a drain voltage (amplitude) and modulated wave signal (phase) using these delay circuits 1412, 1413 and correcting the delay difference between the amplitude signal and phase signal in their respective paths (e.g., see Japanese Patent Publication No. 6-54877 (FIG. 6)).

FIG. 4 illustrates a fourth conventional example of a polar modulation transmitter. This polar modulation transmitter is provided with phase detection sections 1502, 1503 that detect the phase of an RF output signal, an amplitude detection section 1501 that detects the amplitude envelope of the RF output signal, a synchronization detection section 1512 that detects synchronization between the phase and amplitude of the RF output signal and a synchronization control section 1513 that controls a delay section 1515 based on the detected synchronization. It is possible to suppress deterioration of ACLR and EVM due to the delay difference between the amplitude signal and phase signal by adjusting timings of the amplitude signal and phase signal using these sections and correcting the delay difference between the amplitude signal and phase signal in their respective paths (e.g., see National Publication of International Patent Application No. 2002-530992 (FIG.2)).

However, the first conventional example shown in FIG. 1 is not provided with the timing adjusting section and cannot correct the delay difference between the amplitude signal and phase signal in their respective paths and cannot suppress deterioration of transmission quality due to the delay difference.

Furthermore, the polar modulation transmitters in the second conventional example shown in FIG. 2 and third conventional example shown in FIG. 3 have no synchronization circuit that automatically establishes synchronization between the amplitude signal and phase signal, and therefore there is no other way for adjusting synchronization than manual adjustment. Furthermore, after shipment of a product, it is difficult for a general consumer to adjust synchronization when using the product.

Furthermore, the polar modulation transmitter in the fourth conventional example shown in FIG. 4 is constructed in such a way that an amplitude envelope and phase are detected from an RF output signal of the multiplier or power amplifier. However, detecting synchronization between the amplitude signal and phase signal in such a configuration requires an RF band signal to be demodulated into a baseband by some means, which leads to the use of a circuit such as a low pass filter having a delay whose magnitude cannot be ignored. As a result, a delay variation is produced at the time of detection and the accuracy of detection of the delay difference deteriorates.

SUMMARY OF THE INVENTION

It is an object of the present invention to provide a polar modulation transmission apparatus and radio communication apparatus capable of adjusting synchronization between an amplitude signal and phase signal in a simple configuration accurately and automatically.

The present invention adopts a configuration comprising a polar signal generation circuit that generates an amplitude signal for synchronization adjustment and a phase signal for synchronization adjustment, a high-frequency phase modulated signal formation circuit that forms a high-frequency phase modulated signal by modulating a carrier frequency signal using the phase signal, a combination circuit that combines the amplitude signal and phase signal by making the amplitude of the high-frequency phase modulated signal variable according to the amplitude signal, a delay difference detection circuit that detects a delay difference between the amplitude signal for synchronization adjustment and phase signal for synchronization adjustment based on the output from a circuit that processes the phase signal and amplitude signal in their respective baseband signal states, a synchronization adjustment circuit that adjusts synchronization between the amplitude signal and phase signal when the high-frequency phase signal and amplitude signal are combined by adjusting delays of the amplitude signal and phase signal based on the detected delay difference, and can thereby attain the above described object by adjusting synchronization between the amplitude signal and phase signal without using any demodulation circuit.

BRIEF DESCRIPTION OF THE DRAWINGS

The above and other objects and features of the invention will appear more fully hereinafter from a consideration of the following description taken in connection with the accompanying drawing wherein one example is illustrated by way of example, in which.

DETAILED DESCRIPTION OF THE PREFERRED EMBODIMENTS

With reference now to the attached drawings, embodiments of the present invention will be explained in detail below.

Figure 1:
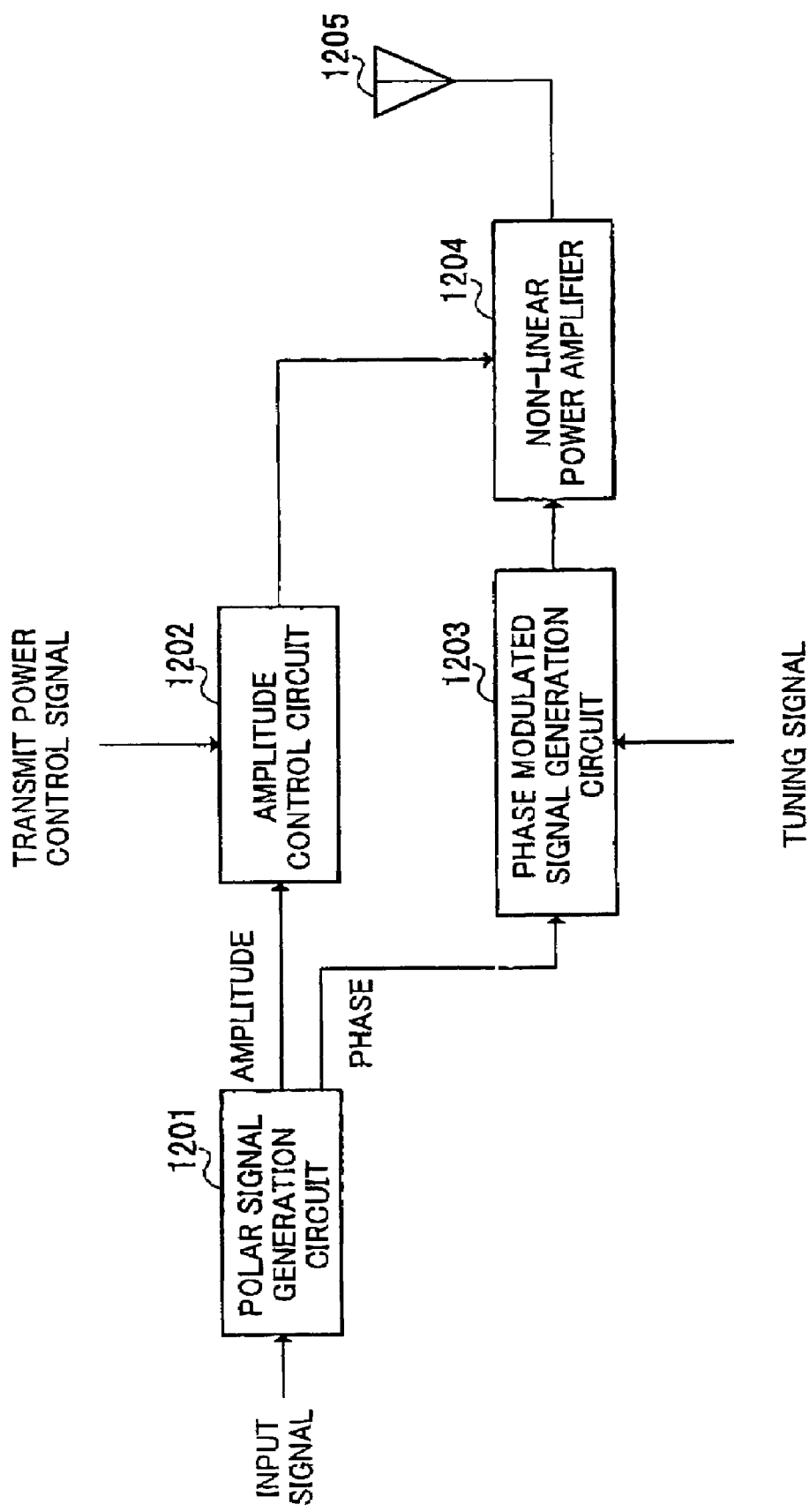
FIG. 1 is a block diagram showing a configuration example of a conventional polar modulation transmission apparatus.
Figure 2:
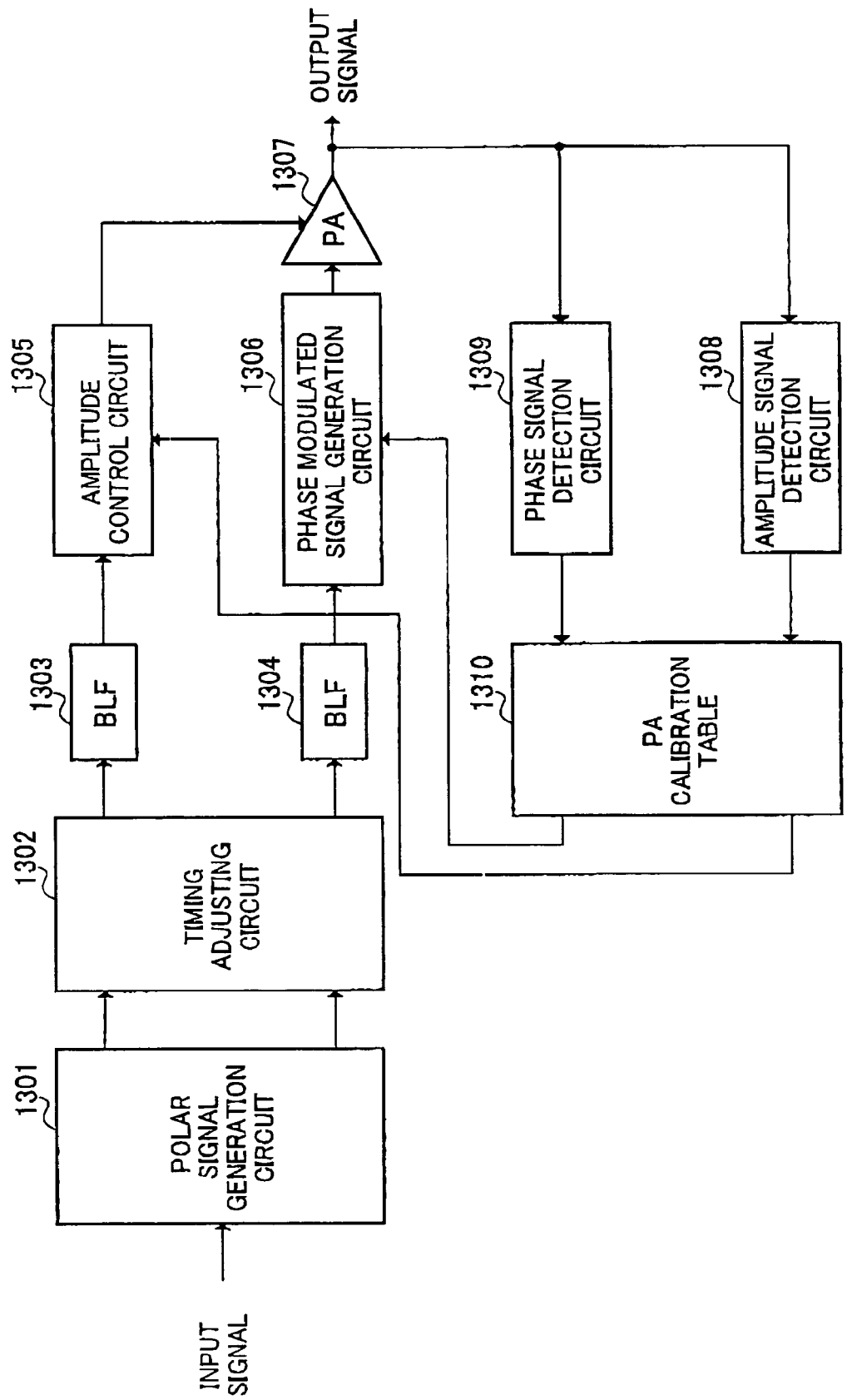
FIG. 2 is a block diagram showing a configuration example of a conventional polar modulation transmission apparatus.
Figure 3:
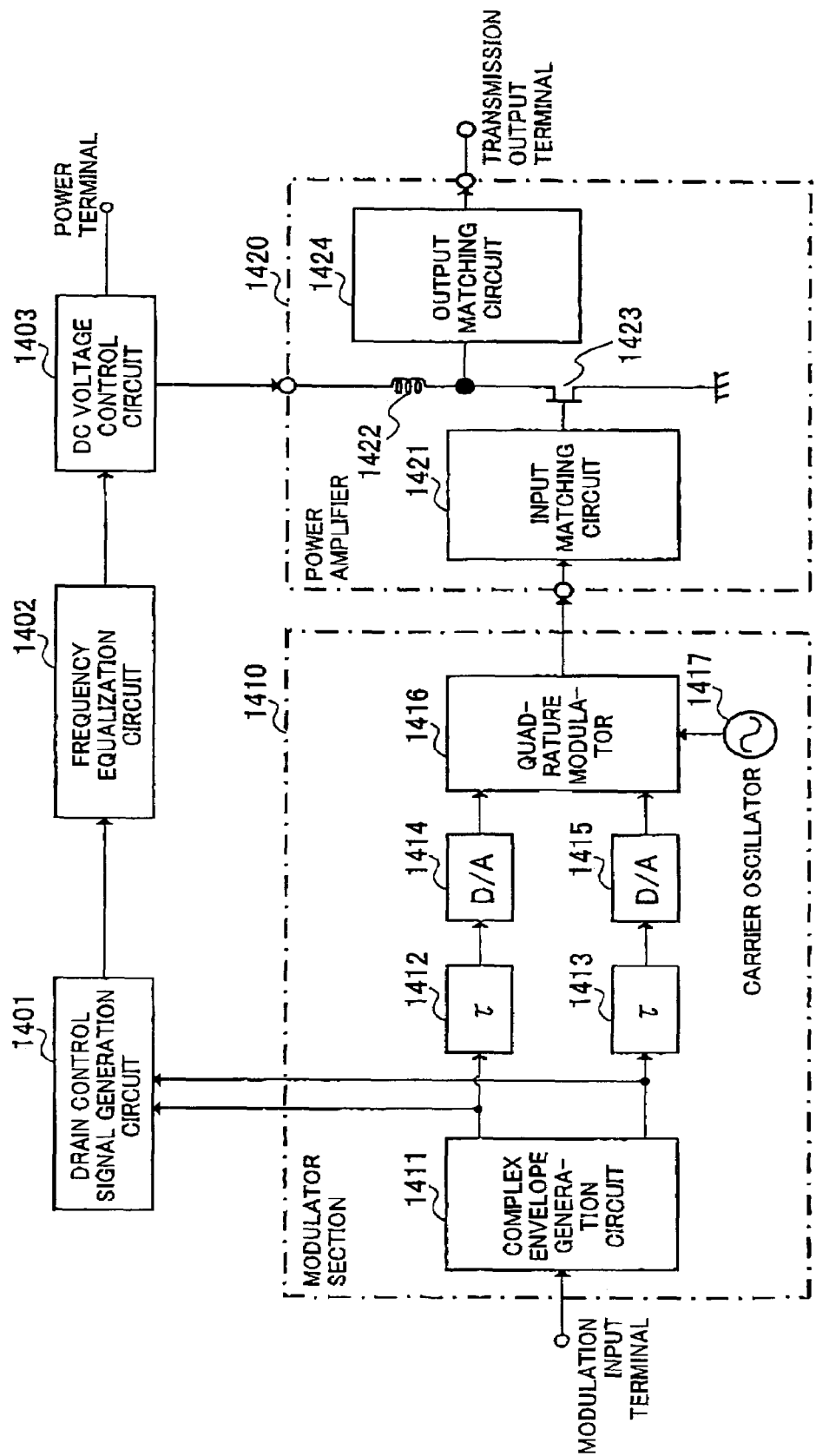
FIG. 3 is a block diagram showing a configuration example of a conventional polar modulation transmission apparatus.
Figure 4:
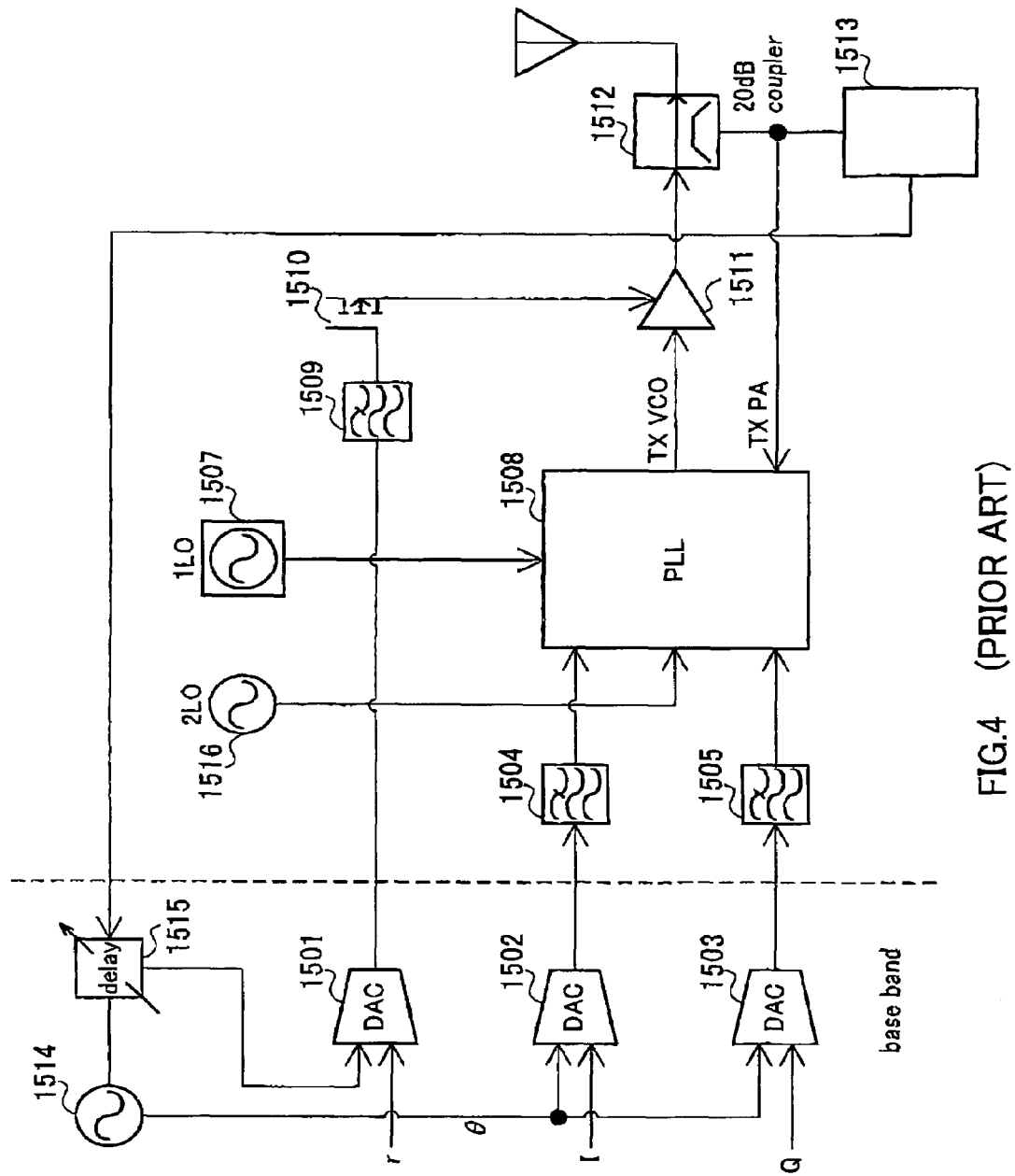
FIG. 4 is a block diagram showing a configuration example of a conventional polar modulation transmission apparatus.
Figure 5:
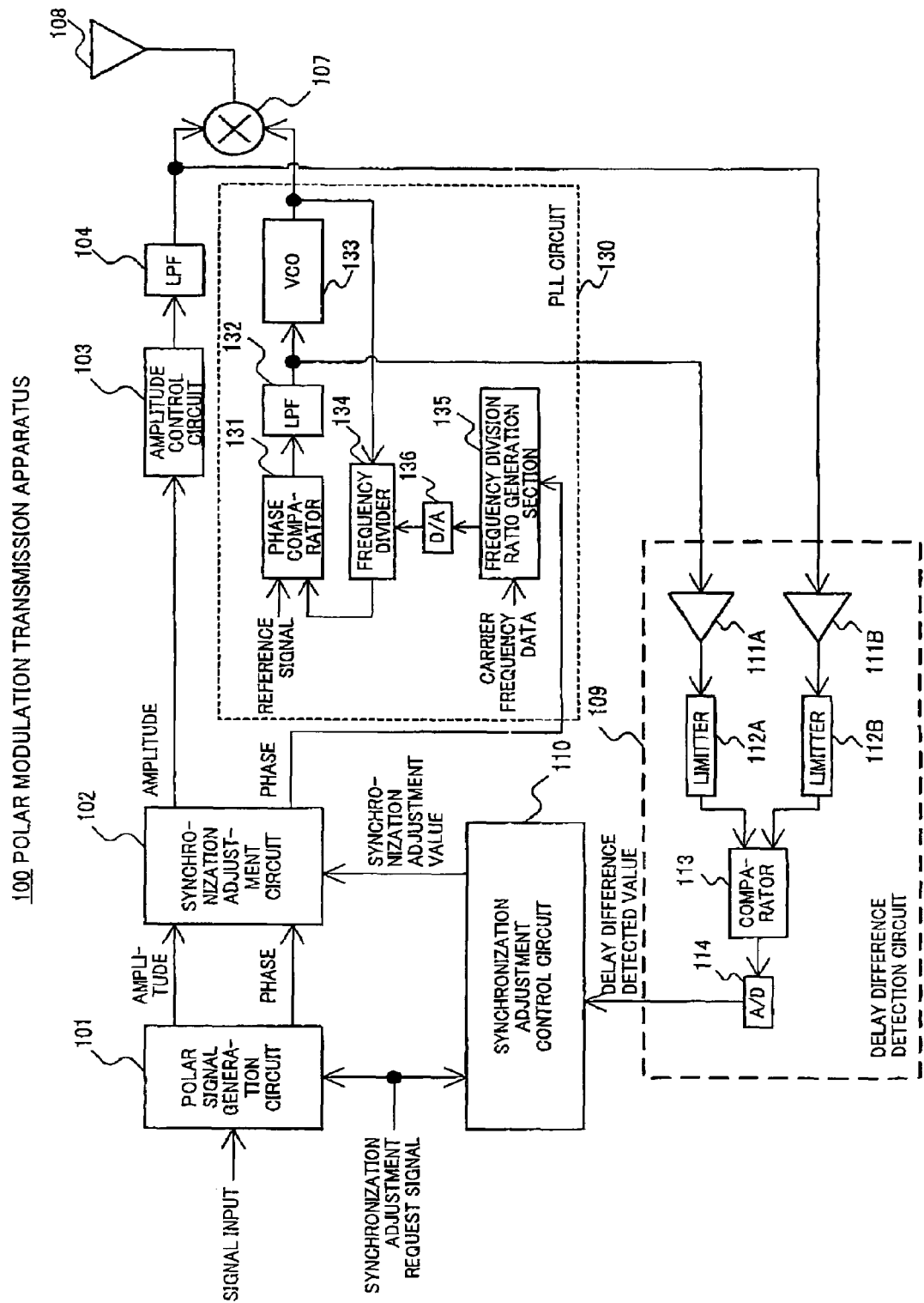
FIG. 5 is a block diagram showing the configuration of a polar modulation transmission apparatus according to an embodiment of the present invention.

FIG. 5 shows the configuration of a polar modulation transmission apparatus according to embodiment 1 of the present invention. The polar modulation transmission apparatus 100 is mounted on a radio communication apparatus such as a portable terminal and its base station apparatus.

The polar modulation transmission apparatus 100 inputs a baseband modulated signal to a polar signal generation circuit 101. The polar signal generation circuit 101 separates the baseband modulated signal into an amplitude signal made up of an amplitude component and a phase signal made up of a phase component. Furthermore, the polar signal generation circuit 101 receives a synchronization adjustment request signal and generates an amplitude signal and a phase signal for synchronization adjustment when this synchronization adjustment request signal requests synchronization adjustment. That is, the polar signal generation circuit 101 outputs an amplitude signal and phase signal based on the baseband modulated signal when synchronization adjustment is not requested on one hand, and outputs an amplitude signal for synchronization adjustment and a phase signal for synchronization adjustment when synchronization adjustment is requested on the other.

Thus, the polar modulation transmission apparatus 100 regards the source of the actual polar modulated signal as identical to the source of the signal for synchronization adjustment, and therefore it is designed so as to be able to prevent an out-of-synchronization state of the actual polar modulated signal by adjusting synchronization using a signal for synchronization adjustment.

A synchronization adjustment circuit 102 has a delay circuit that delays each input signal and delays the amplitude signal and/or phase signal based on a synchronization adjustment value input from a synchronization adjustment control circuit 110 to thereby adjust synchronization between the amplitude signal and phase signal.

Figure 6:
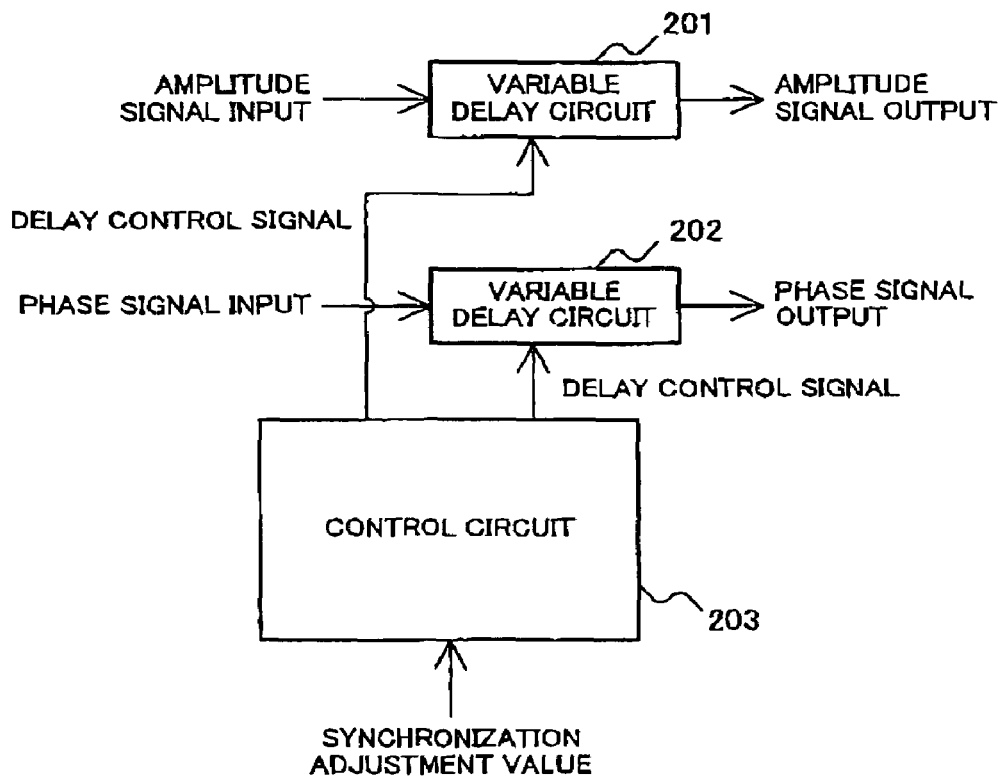
FIG. 6 is a block diagram showing the configuration of a synchronization adjustment circuit.

FIG. 6 shows the configuration of the synchronization adjustment circuit 102. The synchronization adjustment circuit 102 includes variable delay circuits 201, 202. The synchronization adjustment circuit 102 inputs the synchronization adjustment value from the synchronization adjustment control circuit 110 to a control circuit 203. The control circuit 203 sends a delay control signal according to the synchronization adjustment value to the variable delay circuits 201, 202. The variable delay circuits 201, 202 delay the input signal by an amount of delay indicated by the delay control signal and output the delayed input signal. In this way, the synchronization adjustment circuit 102 gives a delay according to the synchronization adjustment value to the amplitude signal input and phase signal input respectively and outputs the signals. FIG. 6 shows the configuration using two variable delay circuits, but it is also possible to adopt a configuration using either variable delay circuit.

The amplitude signal output from the synchronization adjustment circuit 102 is input to an amplitude control circuit 103. The amplitude control circuit 103 amplifies the amplitude signal based on, for example, a transmit power control signal and sends the amplified amplitude signal to a mixer 107 as a combination circuit through a low pass filter (LPF) 104.

On the other hand, the phase signal output from the synchronization adjustment circuit 102 is input to a PLL circuit 130 for frequency-modulating the phase signal into a high-frequency phase modulated signal. The phase signal input to the PLL circuit 130 is combined with carrier frequency data at a frequency division ratio generation section 135 and given to a frequency divider 134 through a digital/analog conversion circuit (D/A) 136. In this way, a high-frequency phase modulated signal whose carrier frequency has been modulated by the phase signal is obtained from a voltage control oscillator 133 and this signal is sent out to the mixer 107 as the combination circuit.

The mixer 107 multiplies the high-frequency phase modulated signal by the amplitude signal. More specifically, a transmission signal is formed by adding an instantaneous variation based on the amplitude signal to an envelope amplitude of the high-frequency phase modulated signal which is a constant envelope signal. In other words, this is equivalent to combining the amplitude signal and phase signal. The transmission signal is sent through an antenna 108.

In addition to such a configuration, the polar modulation transmission apparatus 100 includes a delay difference detection circuit 109. The delay difference detection circuit 109 receives the amplitude signal immediately before being combined with the phase signal and the phase signal immediately before being converted to a high-frequency. In other words, the delay difference detection circuit 109 receives signals from the final stage circuit which processes the signals in their baseband signal states. In the case of FIG. 5, since the final stage circuit which processes the amplitude signal in a baseband signal state is the low pass filter 104, the amplitude signal output from the low pass filter 104 is input, and since the final stage circuit which processes the phase signal in a baseband signal state is the low pass filter 132, the phase signal output from the low pass filter is input.

The delay difference detection circuit 109 inputs the phase signal to a comparator 113 through a voltage follower 111A and a limiter 112A and inputs the amplitude signal to the comparator 113 through a voltage follower 111B and limiter 112B. In this way, providing the limiters 112A, 112B makes it possible to keep constant the magnitudes of the phase signal and amplitude signal input to the comparator 113 independently of the inputs and thereby improve the detection accuracy of the comparator 113. However, the limiters 112A, 112B are not always necessary. Furthermore, providing the voltage followers 111A, 111B makes it possible to increase the input impedance of the delay difference detection circuit 109, preventing an out-of-synchronization state of the actual polar modulated signal even when the power to the delay difference detection circuit 109 is turned OFF after synchronization adjustment is completed. As a result, it is possible to reduce current consumption and extend the battery life in the case of a battery-operated transmitter. However, the voltage followers 111A, 111B are not always necessary.

Figure 7:
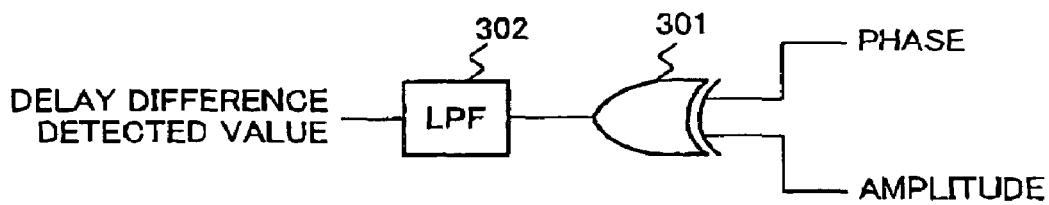
FIG. 7 is a block diagram showing the configuration of a comparator.
Figure 8:
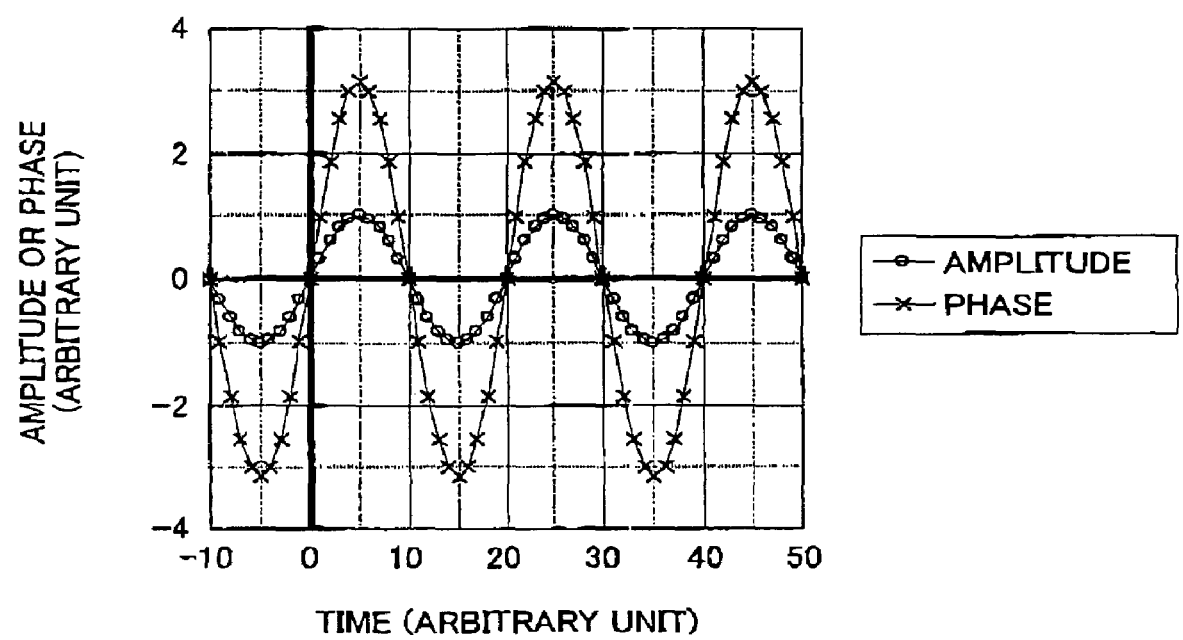
FIG. 8 is a waveform diagram showing a relationship between an amplitude signal and phase signal for synchronization adjustment according to the embodiment.

The comparator 113 compares the amplitude signal and phase signal. The comparison result is sent out to the synchronization adjustment control circuit 110 through an analog/digital conversion circuit (A/D) 114 as a delay difference detected value. FIG. 7 shows a configuration example of the comparator 113. Here, the configuration of the comparator 113 varies depending on what kind of signals are used as the amplitude signal and phase signal for synchronization adjustment generated by the polar signal generation circuit 101, but as shown in FIG. 8, this embodiment assumes a case where sine waves which are mutually in phase are used as signals for synchronization adjustment as an example.

Figure 9:
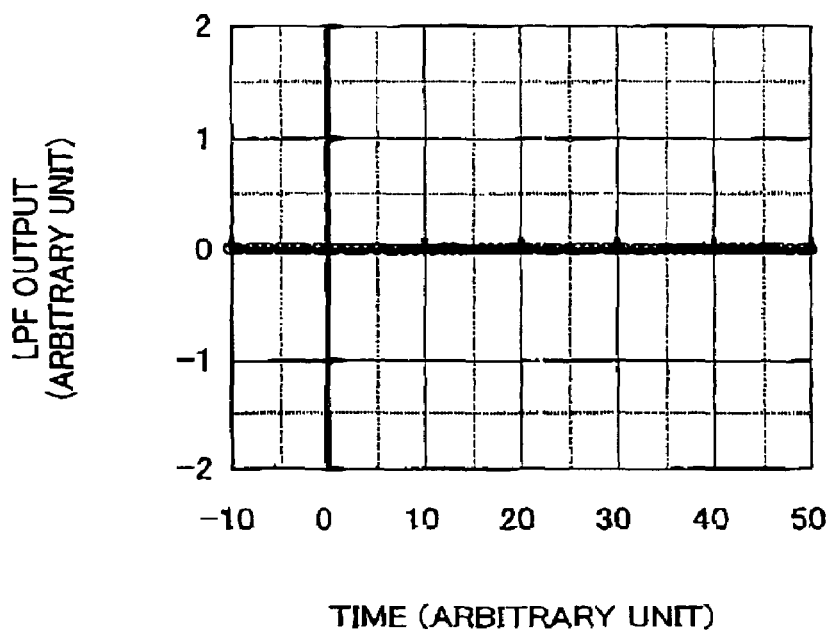
FIG. 9 illustrates a comparator output when there is no delay difference.
Figure 10:
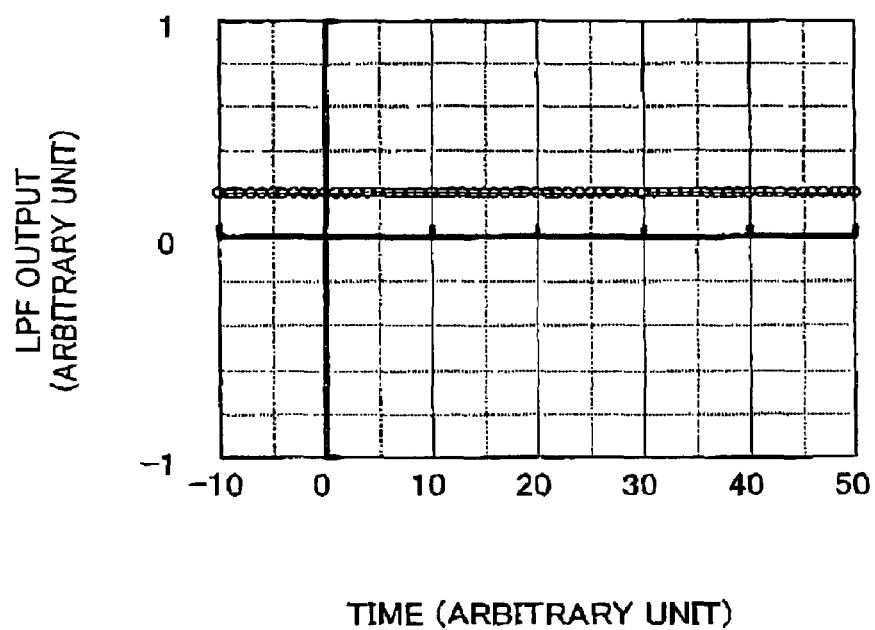
FIG. 10 illustrates a comparator output when there is a delay difference.
Figure 11:
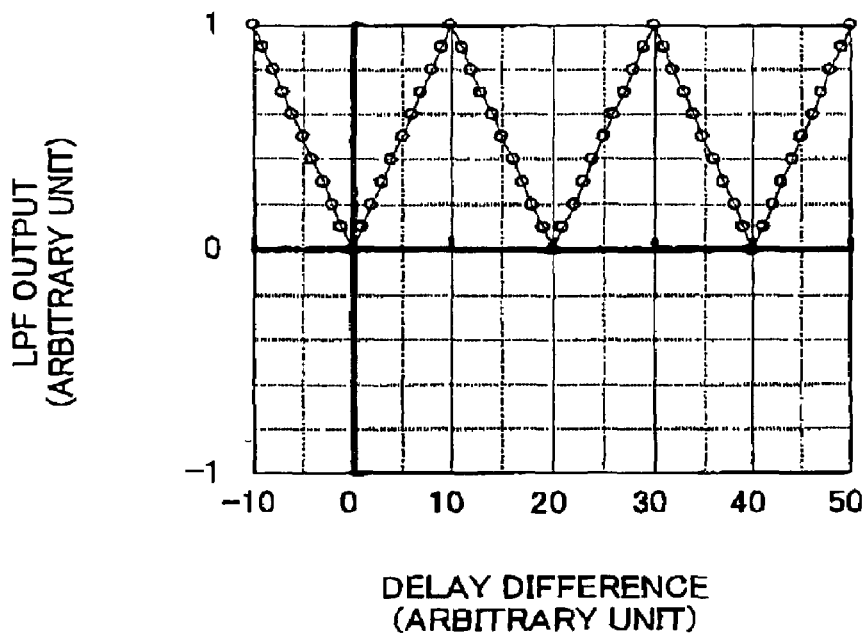
FIG. 11 illustrates a relationship between a delay difference and comparator output.

In this case, the comparator 113 can be made up of an XOR circuit 301 and a low pass filter 302 as shown in FIG. 7. When such a configuration is used, the low pass filter 302 of the comparator 113 outputs a minimum value "0" (FIG. 9) as the delay difference detected value when the two signals; the amplitude signal and phase signal, are in phase and outputs a maximum value "1" (FIG. 10) as the delay difference detected value when the signals have opposite phases. FIG. 11 shows a relationship between the delay difference between the signals and low pass filter output.

Figure 12:
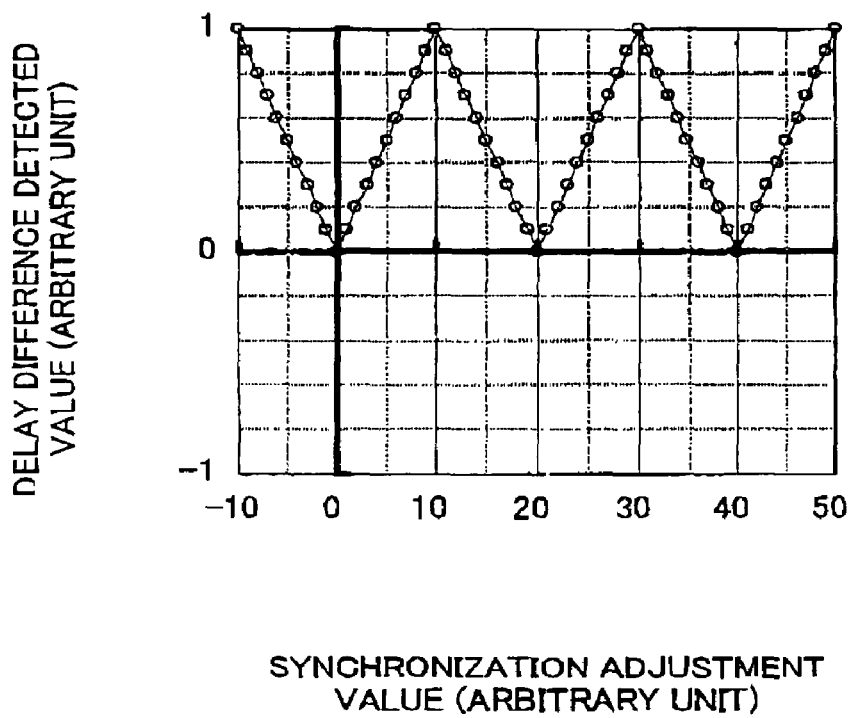
FIG. 12 illustrates a relationship between a delay adjustment value and delay detected value.

The delay difference detected value detected by the delay difference detection circuit 109 is sent out to the synchronization adjustment control circuit 110. The synchronization adjustment control circuit 110 changes the synchronization adjustment value so as to reduce the delay difference based on the delay difference detected value and sends this to the synchronization adjustment circuit 102. FIG. 12 shows a relationship between the synchronization adjustment value and delay difference detected value.

Figure 13:
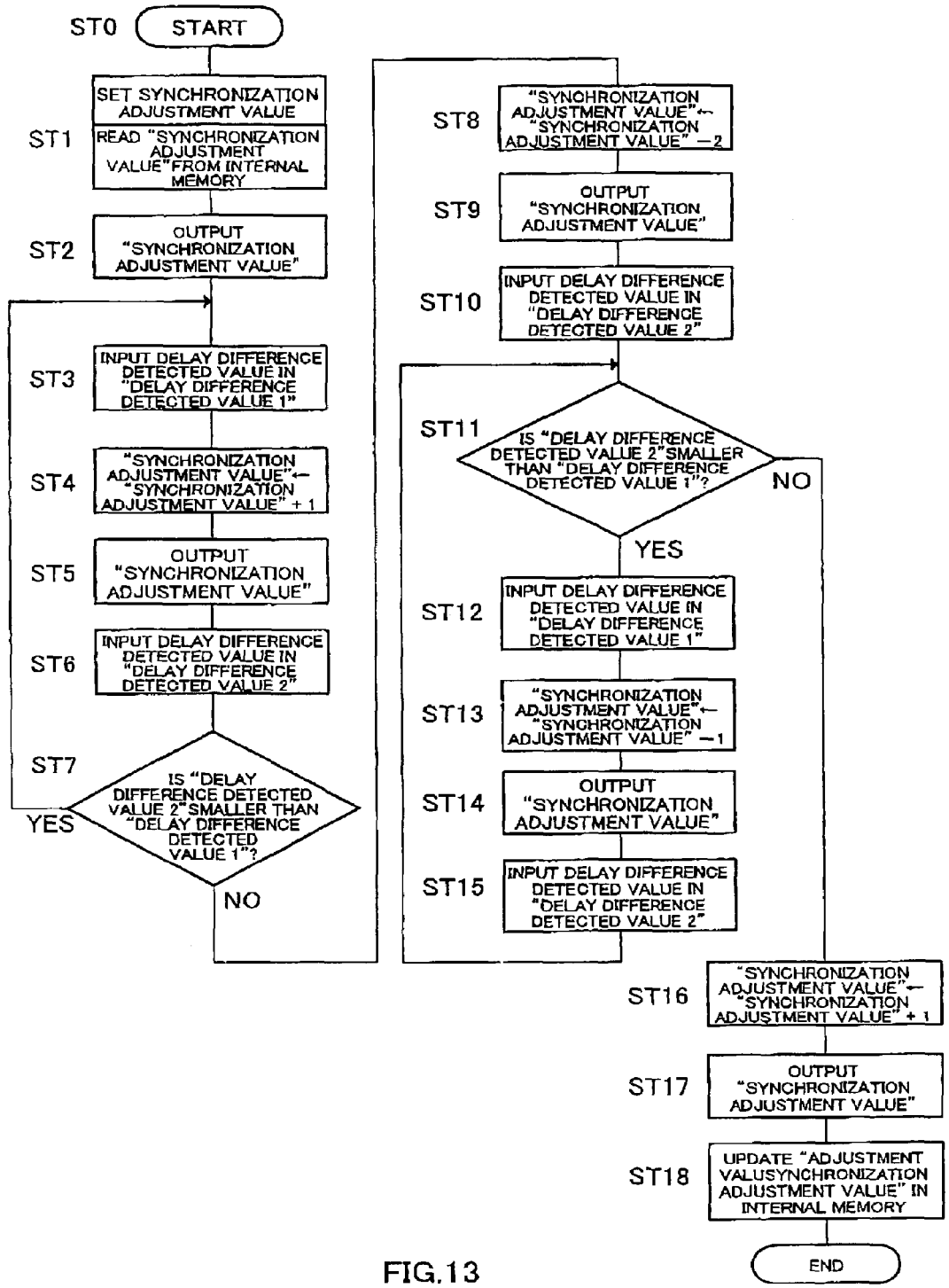
FIG. 13 is a flow chart showing a calculation procedure of a synchronization adjustment value of a synchronization adjustment control circuit.

FIG. 13 shows a procedure for calculating a synchronization adjustment value by the synchronization adjustment control circuit 110. When the synchronization adjustment control circuit 110 starts processing in step ST0 in response to a request for synchronization adjustment, it sets a synchronization adjustment value from an internal memory in step ST1 and sends the synchronization adjustment value to the synchronization adjustment circuit 102 in step ST2.

In step ST3, the synchronization adjustment control circuit 110 stores the current delay difference detected value input from the delay difference detection circuit 109 in a memory as a delay difference detected value 1. In next step ST4, the synchronization adjustment control circuit 110 increments the synchronization adjustment value and sends the incremented synchronization adjustment value to the synchronization adjustment circuit 102 in next step ST5. At this time, based on the incremented synchronization adjustment value, the synchronization adjustment circuit 102 outputs the amplitude signal and phase signal whose delay difference differs from the previous one by the corresponding value.

In step ST6, the synchronization adjustment control circuit 110 receives the current delay difference detected value as a delay difference detected value 2 and in next step ST7, it decides whether the current delay difference detected value 2 is smaller than the delay difference detected value 1 stored in the memory or not. When a positive result is obtained in step ST7, this means that further incrementing the synchronization adjustment value is likely to further reduce the delay difference, and therefore the synchronization adjustment control circuit 110 returns to step ST3. That is, the synchronization adjustment value is increased by repeating the loop of steps ST3-ST4-ST5-ST6-ST7-ST3 until a negative result is obtained in step ST7.

When a negative result is obtained in step ST7, this means that the delay difference is likely to decrease when the synchronization adjustment value is rather reduced or that the current synchronization adjustment value is the synchronization adjustment value that can reduce the delay difference most, and therefore the synchronization adjustment control circuit 110 moves to step ST8, decrements the synchronization adjustment value by −2 (this corresponds to decrementing the original value by −1) and outputs this synchronization adjustment value to the synchronization adjustment circuit 102 in step ST9. Then, in step ST10, the synchronization adjustment control circuit 110 inputs the current delay difference detected value as the delay difference detected value 2 and decides in next step ST11 whether the current delay difference detected value 2 is smaller than the delay difference detected value 1 stored in the memory or not. When a positive result is obtained in step ST11, this means that decrementing the synchronization adjustment value is likely to further decrease the delay difference, and therefore in step ST12, the synchronization adjustment control circuit 110 stores the current delay difference detected value in the memory as the delay difference detected value 1. In next step ST13, the synchronization adjustment control circuit 110 decrements the synchronization adjustment value and sends the decremented synchronization adjustment value to the synchronization adjustment circuit 102 in next step ST14. At this time, based on the decremented synchronization adjustment value, the synchronization adjustment circuit 102 outputs the amplitude signal and phase signal whose delay difference differs from the previous one by the corresponding value.

In step ST15, the synchronization adjustment control circuit 110 inputs the current delay difference detected value as the delay difference detected value 2 and decides in next step ST11 whether the current delay difference detected value 2 is smaller than the delay difference detected value 1 stored in the memory or not. When a positive result is obtained in step ST11, this means that further decrementing the synchronization adjustment value is likely to further decrease the delay difference, and therefore the synchronization adjustment control circuit 110 moves to step ST12. That is, the synchronization adjustment value is decreased by repeating the loop of steps ST11-ST12-ST13-ST14-ST15-ST11 until a negative result is obtained in step ST11.

On the contrary, when a negative result is obtained in step ST11, this means that the synchronization adjustment value that has given the delay difference detected value 1 is the synchronization adjustment value that can reduce the delay difference between signals most, and therefore the synchronization adjustment control circuit 110 increments the current synchronization adjustment value in step ST16 to thereby return the synchronization adjustment value to the one that gives the delay difference detected value 1 and then outputs this synchronization adjustment value to the synchronization adjustment circuit 102 in step ST17.

That is, the synchronization adjustment value output in step ST17 is the adjustment value that can minimize the delay difference between the signals when the amplitude signal and phase signal are combined by the mixer 107. In next step 18, the synchronization adjustment control circuit 110 stores this delay adjustment value in the internal memory. Or it stores the delay adjustment value in an internal memory of the synchronization adjustment circuit 102. In step ST19, the synchronization adjustment control circuit 110 finishes the calculation procedure of the synchronization adjustment value. Then, the synchronization adjustment circuit 102 gives a delay corresponding to the stored delay adjustment value to each signal and outputs the signal until the next request for synchronization adjustment is received.

In the polar modulation transmission apparatus 100, with an optimal synchronization adjustment value set in the synchronization adjustment circuit 102 in this way, the baseband modulated signal is separated into the amplitude signal and phase signal by the polar signal generation circuit 101 and the respective signals are passed through the synchronization adjustment circuit 102 and then carried by the transmission lines of the respective signals and combined by the mixer 107. At this time, since synchronization is established up to the final state of the baseband signal, substantially no out-of-synchronization state occurs at the time of combination in the mixer 107, and it is possible to obtain a transmission signal of high quality. That is, the principal delay sources on the respective transmission lines of the amplitude signal and phase signal are the low pass filters 104, 132, and therefore if the outputs of the low pass filters 104, 132 are incorporated into the delay difference detection circuit 109, it is possible to eliminate the substantial delay difference between the signals and substantially prevent an out-of-synchronization state between the amplitude signal and phase signal when the respective signals are combined.

Furthermore, though the synchronization adjustment request signal has not been described in detail, it is possible to output a synchronization adjustment request, for example, periodically or when power is turned ON and there may be various timings at which a request is output. For example, when the polar modulation transmission apparatus 100 is provided for a radio base station, it is effective to output a synchronization adjustment request when the baseband processing system is changed. Furthermore, the synchronization adjustment request signal can be generated by a controller, etc., that controls the entire polar modulation transmission apparatus 100.

Thus, this embodiment provides the polar signal generation circuit 102 that sends an amplitude signal and phase signal for synchronization adjustment to the transmission lines of the respective signals, delay difference detection circuit 109 that incorporates the amplitude signal and phase signal for synchronization adjustment output from the final stage circuit which processes the signals in their baseband signal states, and circuits 110, 102 that perform synchronization adjustment of the respective signals so as to eliminate the delay difference between the signals based on the delay difference detection result, and can thereby realize the polar modulation transmission apparatus 100 capable of performing synchronization adjustment when the amplitude signal and phase signal are combined automatically and reliably in a relatively simple configuration.

The above described embodiment has described the case where the delay difference detection circuit 109 incorporates the amplitude signal and phase signal for synchronization adjustment output from the final stage circuits (low pass filters 104, 132 in the case of the embodiment) that process the signals in their baseband signal states, but in short, it is possible to obtain effects similar to those of this embodiment if a baseband signal which has passed through all circuits producing a large delay difference is incorporated.

Furthermore, the above described embodiment has described the case where the same circuit (polar signal generation circuit 101) is used for the circuit that generates an amplitude signal for synchronization adjustment and a phase signal for synchronization adjustment and the circuit that generates an amplitude signal made up of an amplitude component and a phase signal made up of a phase component from an input transmission baseband modulated signal, but these circuits need not necessarily be the same circuit and it is also possible to provide a polar signal generation circuit that generates an amplitude signal for synchronization adjustment and a phase signal for synchronization adjustment aside from the polar signal generation circuit that generates the amplitude signal made up of the amplitude component and the phase signal made up of the phase component from the input transmission baseband modulated signal. However, it is preferable to place the circuit that generates a polar signal for synchronization adjustment as close as possible to the circuit that generates an actual polar signal and placing the two circuits at the same position as in the case of the embodiment is most preferable because it is thereby possible to reliably prevent an out-of-synchronization state of the actual polar modulated signals at the time of combination.

Furthermore, for simplicity of explanation, the above described embodiment has shown the polar signal generation circuit 101 and synchronization adjustment circuit 102 as separate blocks, but it is also possible to cause the polar signal generation circuit 101 to carry out synchronization adjustment.

Furthermore, the above described embodiment has described the case where the mixer 107 is used as the combination circuit that combines the amplitude signal and phase signal by making variable the amplitude of the high-frequency phase modulated signal according to the amplitude signal as an example, but the combination circuit is not limited to this and the combination circuit can also be a power amplifier or a variable gain amplifier, for example.

Figure 14:
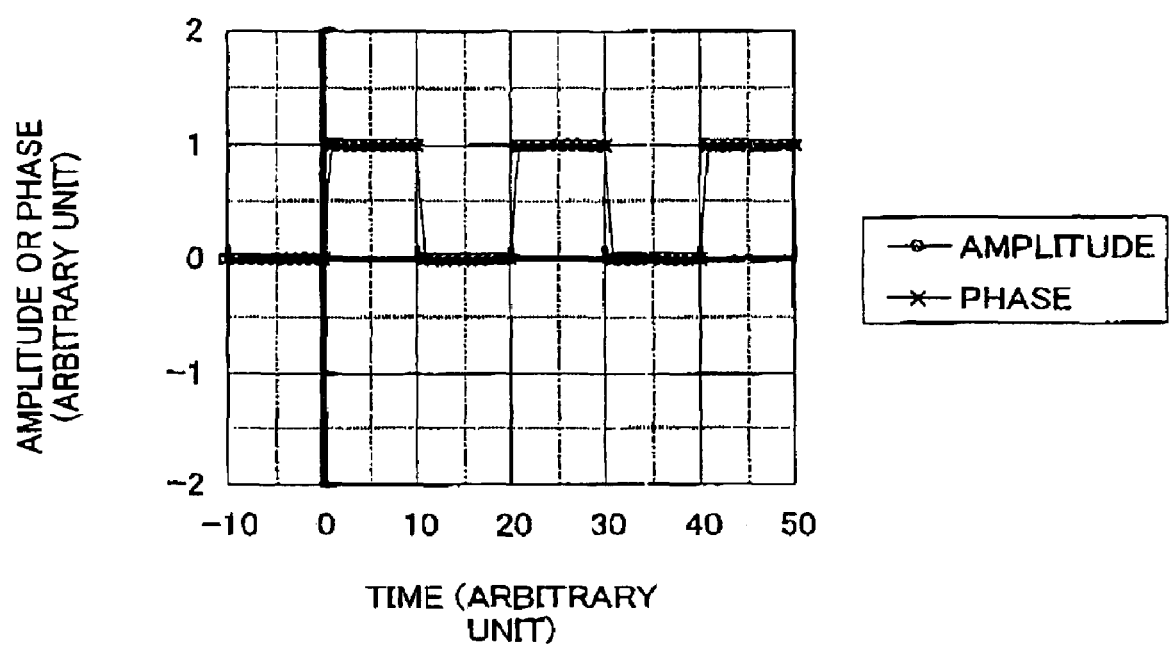
FIG. 14 is a waveform diagram showing another example of the amplitude signal and phase signal for synchronization adjustment.
Figure 15:
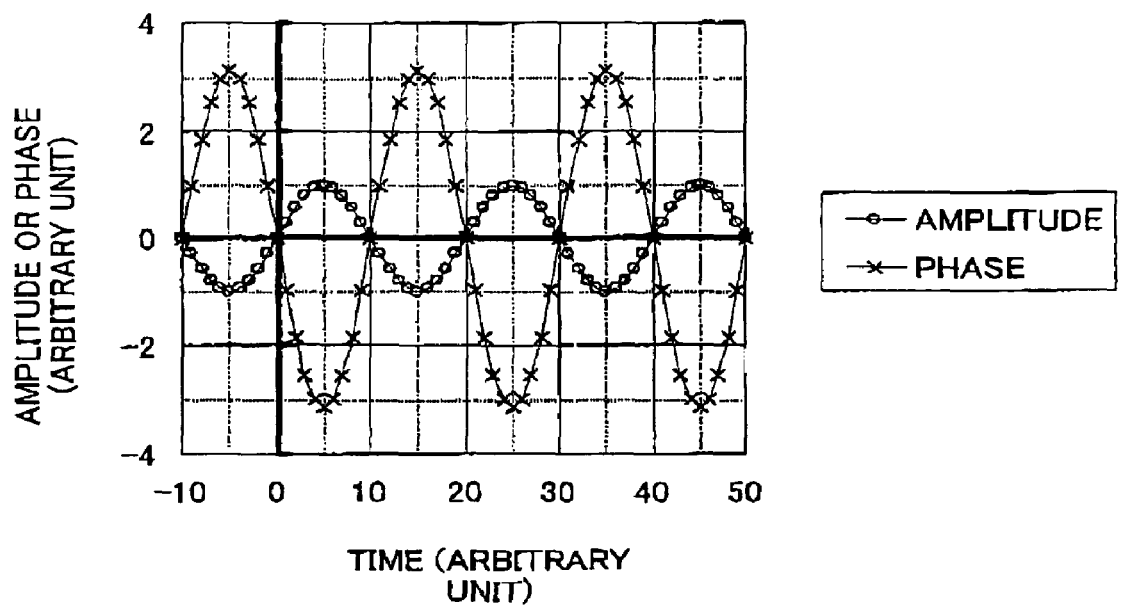
FIG. 15 is a waveform diagram showing a further example of the amplitude signal and phase signal for synchronization adjustment.
Figure 16:
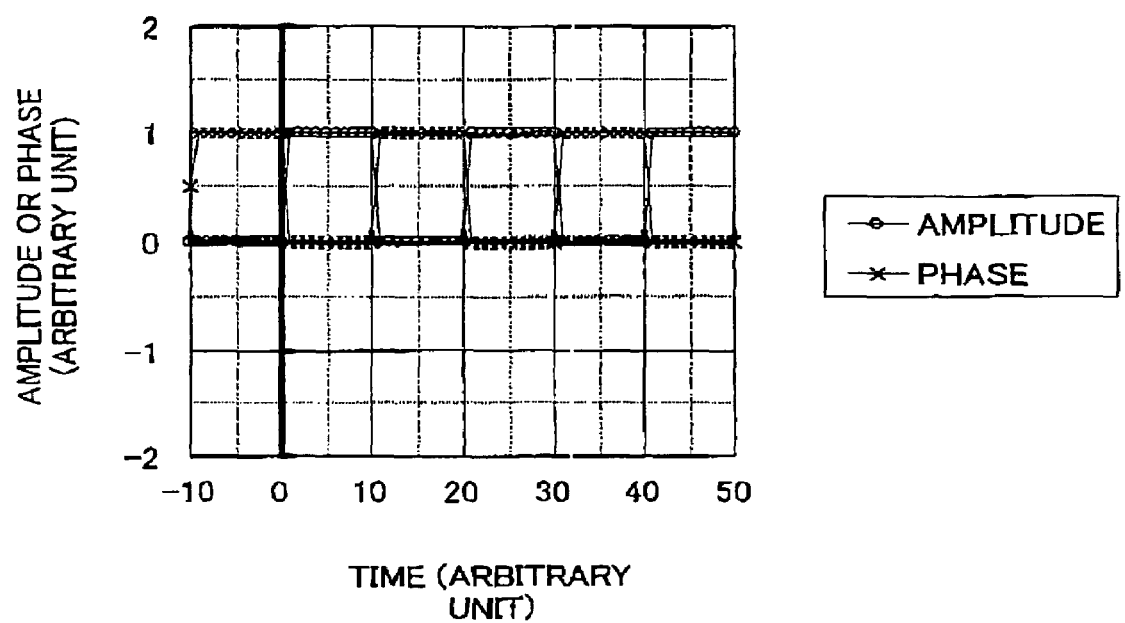
FIG. 16 is a waveform diagram showing a still further example of the amplitude signal and phase signal for synchronization adjustment.

Furthermore, the above described embodiment has described the case where sine waves of the same phase are used as synchronization adjustment signals, but the synchronization adjustment signals are not limited to this and square waves of the same phase as shown in FIG. 14 can also be used or sine waves of opposite phases as shown in FIG. 15 can also be used or square waves of opposite phases as shown in FIG. 16 can also be used. When signals of opposite phases are used, it is of course possible to perform synchronization adjustment in such a way that the delay difference detection circuit 109 detects signals of opposite phases. Furthermore, the configuration of the logical circuit of the comparator 113 can also be changed according to what kind of synchronization adjustment signal is used.

Here, an appropriate signal to be used as the synchronization adjustment signal will be presented. Any signal can be used if it can at least detect a phase difference between the amplitude signal and phase signal in principle, but optimal examples among them will be presented.

(i) It is preferable to use at least a periodic signal with the period of an amplitude signal and the period of a phase signal having such a relationship that one is an integer multiple of the other.

(ii) It is more preferable to use a periodic signal having the period of an amplitude signal identical to the period of a phase signal because this facilitates detection of a delay difference. This case applies to this embodiment.

(iii) It is quite preferable to use a periodic signal having the period of an amplitude signal identical to the period of a phase signal and with the period being initially long and gradually becoming shorter because this makes it possible to perform rough adjustment and then fine adjustment. That is, it is preferable to initially establish rough synchronization at a low frequency, finally transmit a synchronization adjustment signal at the highest frequency among polar modulated signals to be actually transmitted and establish synchronization accurately.

In the case of the phase signal, high-frequency phase modulated signal formation processing by the voltage control oscillator 133 is performed from the baseband signal to combination by the mixer 107 and further the processing by the mixer 107 is performed from the input to the output of the phase signal and amplitude signal, and therefore it is also effective to cause the synchronization adjustment circuit 102 to delay the amplitude signal or phase signal a little more or less than the optimal synchronization adjustment value in anticipation of this processing. By so doing, even when, for example, another circuit that processes each signal at a radio frequency is inserted between the final stage circuit that processes signals in baseband states and the combination circuit, a delay difference from this other circuit is stored as an amount of delay correction beforehand, and it is thereby possible to perform synchronization adjustment with also the delay difference of this other circuit taken into account without providing any demodulation circuit.

Figure 17:
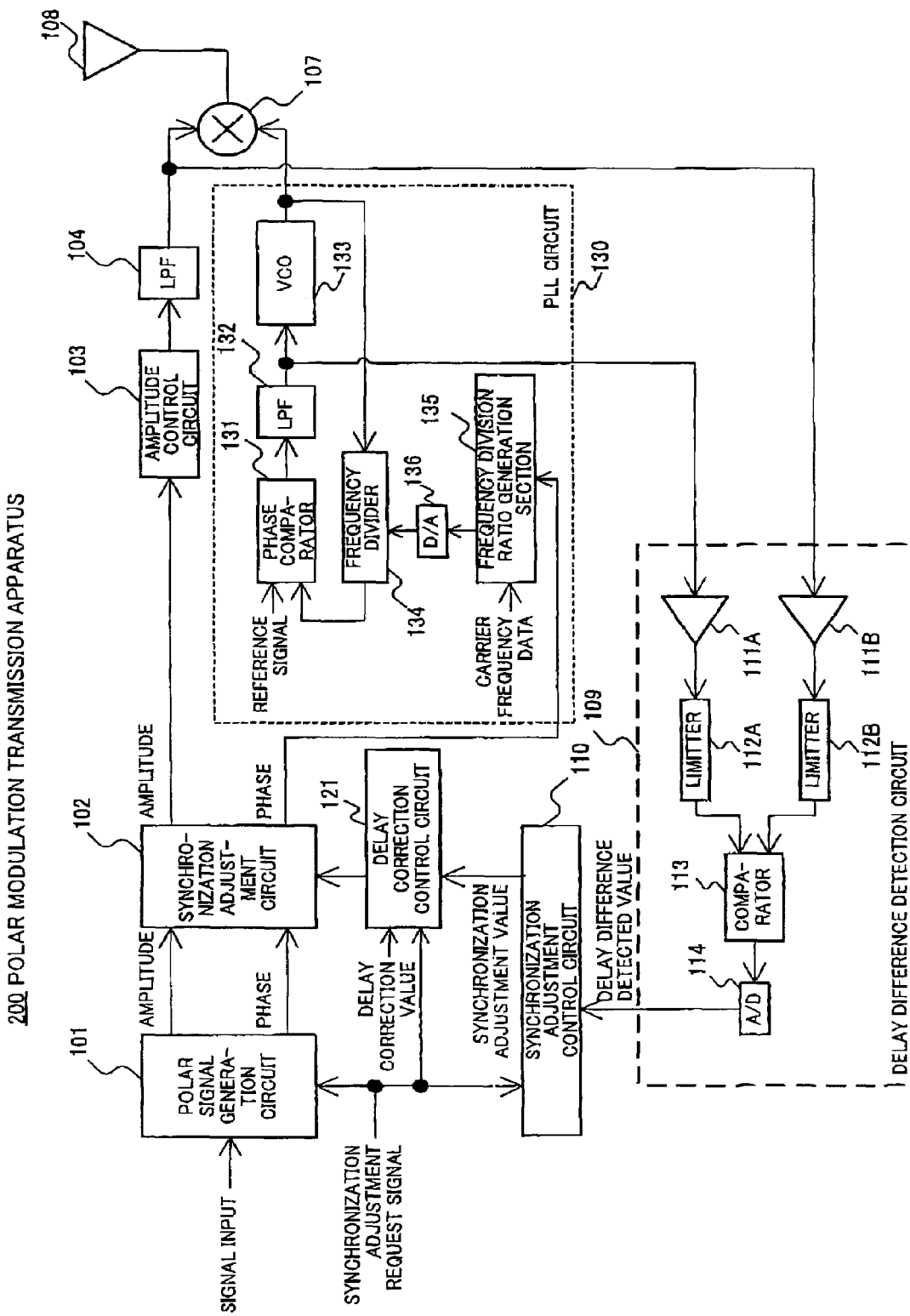
FIG. 17 is a block diagram showing the configuration of a polar modulation transmission apparatus according to an embodiment of the present invention.

FIG. 17 shows an example of correcting a difference between the amount of delay from the output of the final stage circuit that processes the phase signal in a baseband signal state to the output of the combination circuit and the amount of delay from the output of the final stage circuit that processes the amplitude signal in a baseband signal state to the output of the combination circuit. The polar modulation transmission apparatus 200 in FIG. 17 has the same configuration as that in FIG. 5 except that a delay correction control circuit 121 is provided between the synchronization adjustment control circuit 110 and synchronization adjustment circuit 102. The delay correction control circuit 121 can correct the time corresponding to the high-frequency phase modulated signal formation processing at the voltage control oscillator 133 by changing the synchronization adjustment value by an amount corresponding to the delay correction value which is the time required for the voltage control oscillator 133 to form a high-frequency phase modulated signal (that is, a processing delay at the voltage control oscillator 133). When a synchronization adjustment value is calculated in response to a synchronization adjustment request signal, it is necessary to exclude the delay correction value, and therefore when a synchronization adjustment request is received, the synchronization adjustment value from the synchronization adjustment control circuit 110 is directly sent to the synchronization adjustment circuit 102 without changing the synchronization adjustment value. The delay correction value can be stored in a memory (not shown) beforehand.

The delay correction value may also be an amount of delay from the output of the final stage circuit that processes the phase signal in a baseband signal state to the output of the high-frequency phase modulated signal formation circuit and can also be made changeable according to a usage condition (frequency, temperature, etc.) of the polar modulation transmission apparatus.

Furthermore, a feature of the above described embodiment is that the positions at which the phase signal and amplitude signal are acquired to detect a delay difference are determined to be a position before the signals are combined and the outputs of the final stage circuits that process the signals in their baseband signal states. This makes it possible to detect a delay difference between the signals easily and minimize the out-of-synchronization state at the time of combination. Therefore, the acquisition positions of signals become important. These acquisition positions will be explained in further detail below.

Figure 18:
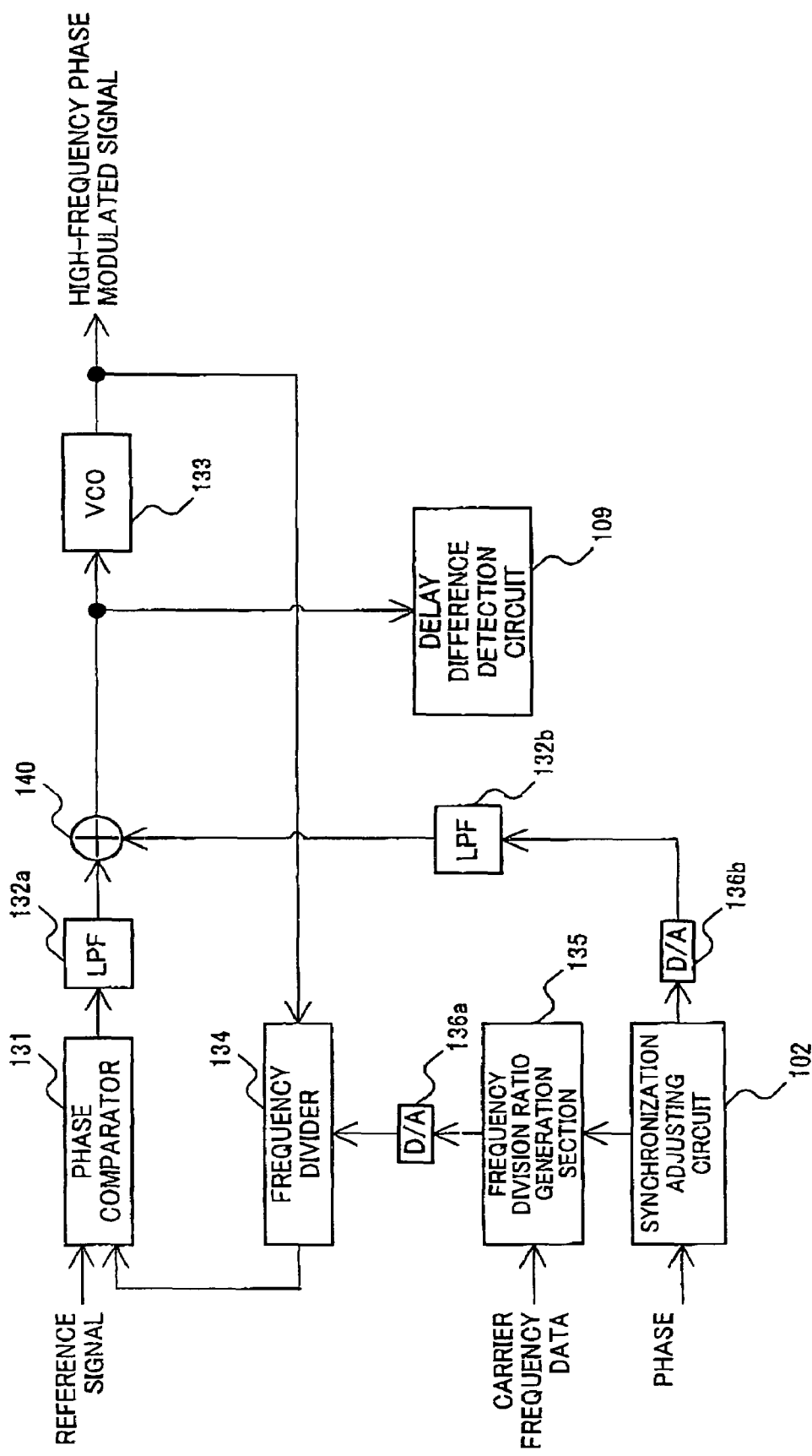
FIG. 18 is a block diagram showing the acquisition position of a phase signal for synchronization adjustment.

FIG. 18 shows a specific example of the acquisition position of a phase signal. FIG. 18 is a specific example where a 2-point modulation type PLL circuit is used.

In the 2-point modulation type PLL circuit as shown in FIG. 18, the output of a synchronization adjustment circuit is given to a frequency divider through a frequency division ratio generation section and a digital/analog conversion circuit (D/A) 136a and at the same time given to an adder 140 through a digital/analog conversion circuit (D/A) 136b and a low pass filter 132b. This 2-point modulation type PLL circuit is a known technology and will not be described in detail, but when the 2-point modulation type PLL circuit is used, even when the bandwidth of the PLL circuit is set to be narrower than the modulation bandwidth, it is possible to output a high-frequency phase modulated signal with a wide band that extends to even outside the PLL band, and therefore it is possible to suppress deterioration of the noise characteristic due to the PLL. Which such a 2-point modulation type PLL circuit is used, it is possible to extract the phase signal for synchronization adjustment from a midpoint of connection between the adder 140 and voltage control oscillator 133.

Figure 19:
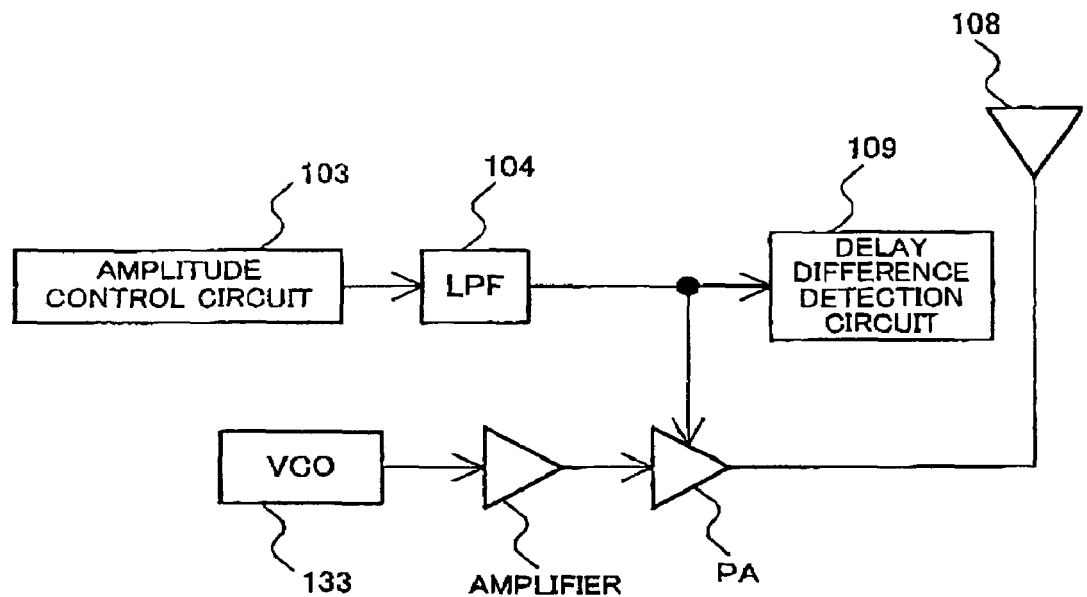
FIG. 19 is a block diagram showing the acquisition position of an amplitude signal for synchronization adjustment.
Figure 20:
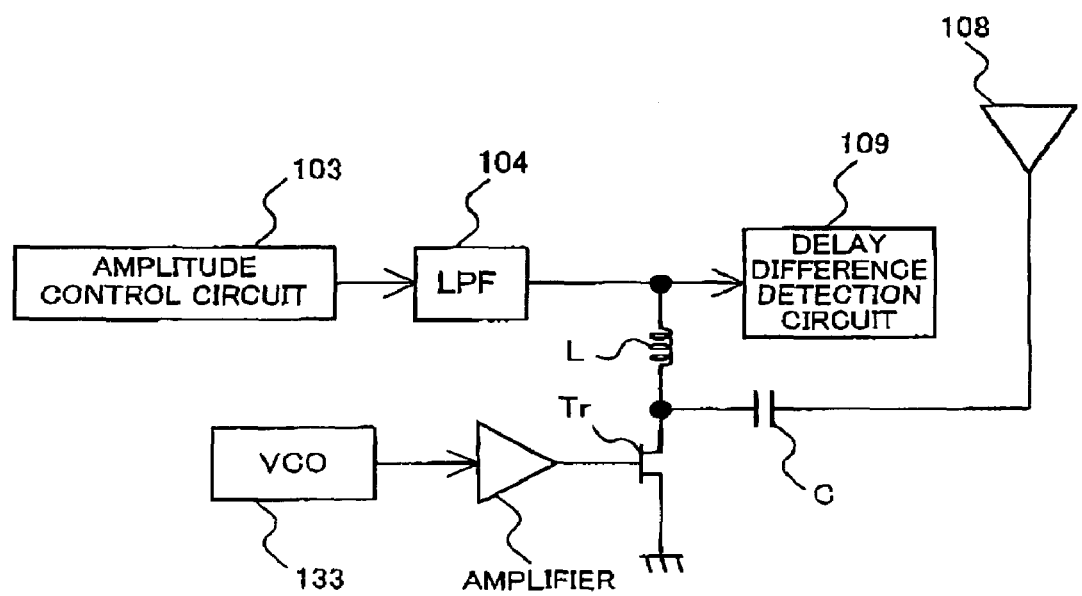
FIG. 20 is a block diagram showing the acquisition position of an amplitude signal for synchronization adjustment.
Figure 21:
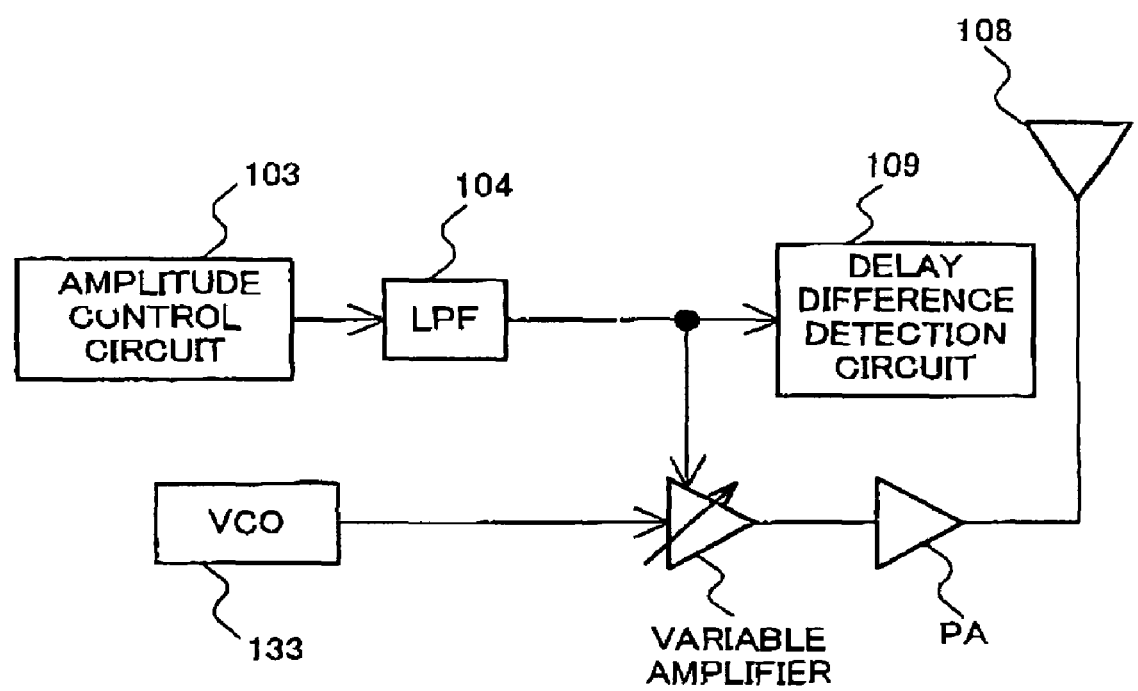
FIG. 21 is a block diagram showing the acquisition position of an amplitude signal for synchronization adjustment.

Specific examples of the acquisition position of an amplitude signal are shown in FIG. 19, FIG. 20 and FIG. 21. As shown in FIG. 19, when a power amplifier (PA) is used as the mixer 107 and an amplitude signal is used as the supply voltage of the power amplifier, it is possible to extract the amplitude signal for synchronization adjustment from the midpoint of connection between a low pass filter 104 and the power amplifier. FIG. 20 shows an example where the power amplifier in FIG. 19 is constructed of a transistor Tr, inductor L and capacitor C, etc., and in this case, it is possible to extract the amplitude signal for synchronization adjustment from the power input terminal of the power amplifier (outside of the inductor L connected to the collector of the transistor Tr). FIG. 21 shows a case where a variable gain amplifier is provided before a power amplifier and an amplitude signal is given as a gain of the variable gain amplifier and in such a case, it is possible to extract the amplitude signal for synchronization adjustment before being input to the variable gain amplifier.

Though the above described embodiment has shown the delay difference detection circuit 109 and synchronization adjustment control circuit 110 as separate blocks for simplicity of explanation, it goes without saying that the synchronization adjustment control circuit 110 may also be provided inside the delay difference detection circuit.

Figure 22:
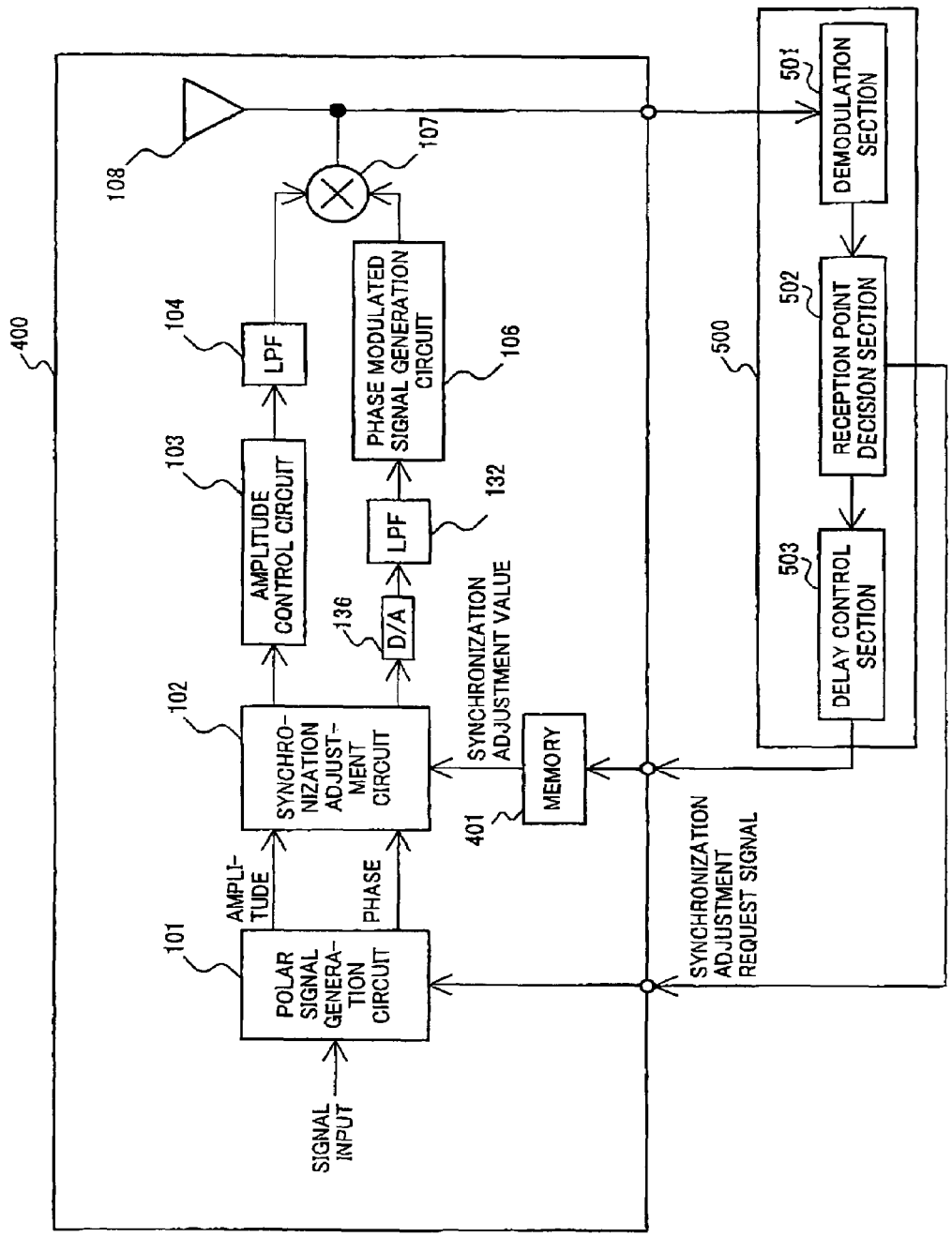
FIG. 22 is a block diagram showing an example where detection of a delay difference and control of synchronization adjustment are performed outside.

Furthermore, the above described embodiment has described the case where the delay difference detection circuit 109 and synchronization adjustment control circuit 110 are provided inside the polar modulation transmission apparatus 100 and synchronization adjustment is performed by these circuits, but as shown in FIG. 22, synchronization adjustment may also be performed by a synchronization adjustment apparatus 500 outside the polar modulation transmission apparatus 400. Here, the synchronization adjustment apparatus 500 inputs a transmission signal output from the mixer 107 to a demodulation section 501. The demodulation section 501 demodulates the transmission signal and sends the demodulated signal to a reception point decision section 502. The reception point decision section 502 decides based on the constellation of the demodulated signal whether the transmission signal has been transmitted or not from the mixer 107 with synchronization between the amplitude signal and phase signal established.

Figure 23:
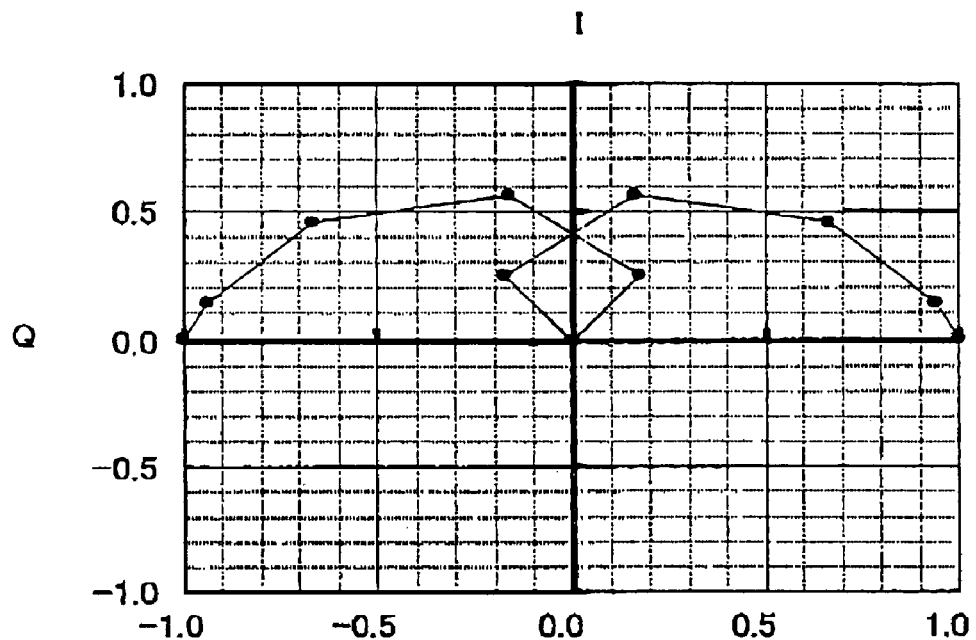
FIG. 23 illustrates a constellation when synchronization is established.
Figure 24:
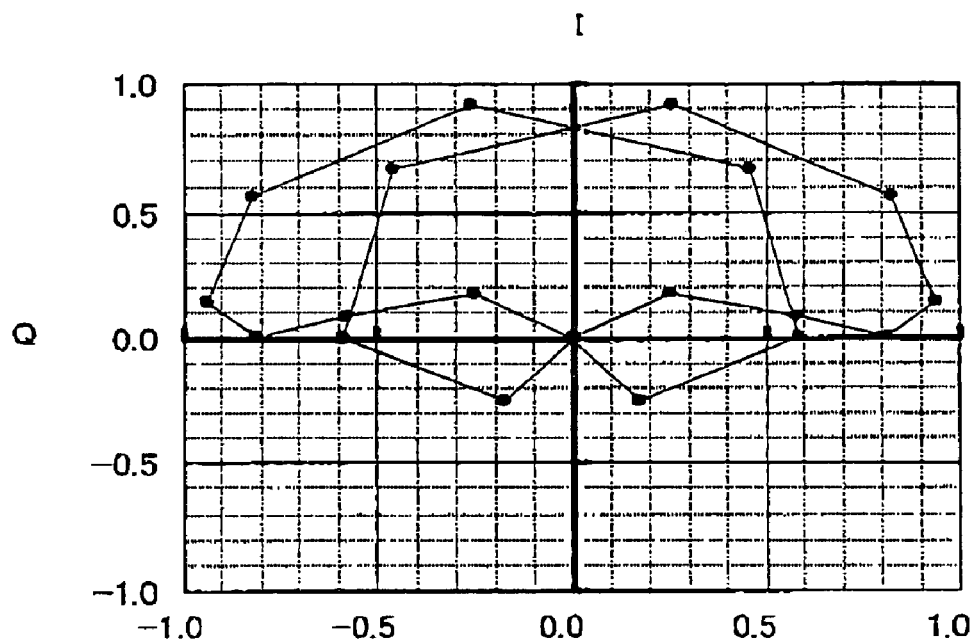
FIG. 24 illustrates a constellation when synchronization is not established.

FIG. 23 shows a constellation example where synchronization is established (that is, there is no delay difference between the amplitude signal and phase signal at the time of combination) and FIG. 24 shows a constellation in a case where synchronization is not established (that is, there is some delay difference between the amplitude signal and phase signal at the time of combination). A delay control section 503 supplies a delay difference adjustment signal to a synchronization adjustment circuit 102 through a memory 401 to obtain the constellation in FIG. 23. Then, when the constellation as shown in FIG. 23 is obtained, the delay difference adjustment signal at that time is written into the memory 401 as the synchronization adjustment value. Furthermore, the reception point decision section 502 requests a polar signal generation circuit 101 to generate an amplitude signal and phase signal for synchronization when synchronization adjustment is in progress.

Figure 25:
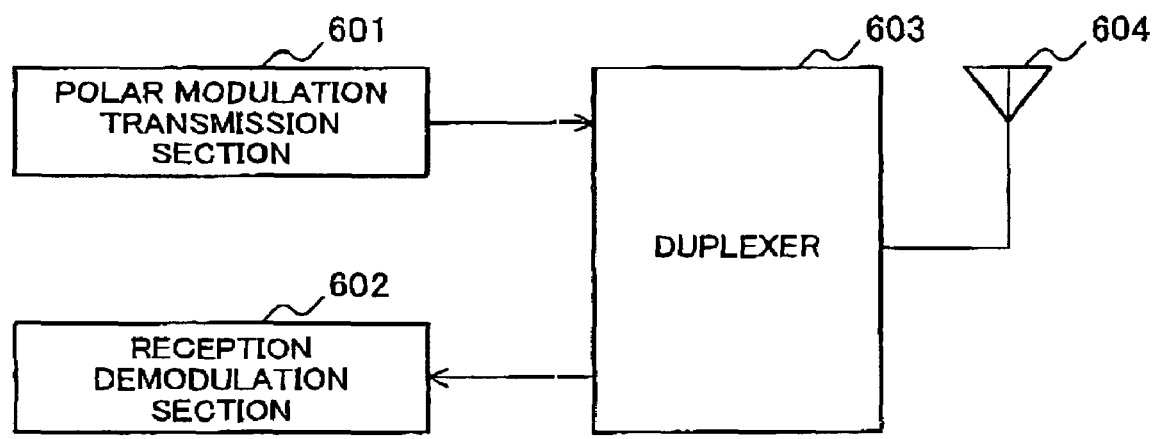
FIG. 25 is a block diagram showing the configuration of a radio communication apparatus.

The present invention is suitable for use in a radio communication apparatus such as a cellular phone set and its base station, etc. FIG. 25 shows a configuration example of a radio communication apparatus provided with the polar modulation transmission apparatus of the present invention. A radio communication apparatus 600 is provided with a polar modulation transmission section 601 (corresponding to the configuration with the antenna 108 removed from the polar modulation transmission apparatus 100, 200) in the above described configuration, a reception demodulation section 602 that carries out predetermined reception processing such as demodulation processing on a received signal, a duplexer 603 that switches between a transmission signal and received signal and an antenna 604. This allows the radio communication apparatus 600 to form a polar modulated signal with an out-of-synchronization state between the phase signal and amplitude signal suppressed, and can thereby carry out high quality transmission. For example, when the radio communication apparatus is a cellular phone set, it is possible to transmit a high quality speech signal and data with an improved error rate characteristic.

As explained above, an aspect of the polar modulation transmission apparatus of the present invention adopts a configuration comprising a polar signal generation circuit that generates an amplitude signal for synchronization adjustment and a phase signal for synchronization adjustment, a high-frequency phase modulated signal formation circuit that forms a high-frequency phase modulated signal by modulating a carrier frequency signal with the phase signal, a combination circuit that combines the amplitude signal and phase signal by making variable the amplitude of the high-frequency phase modulated signal according to the amplitude signal, a delay difference detection circuit that detects a delay difference between the amplitude signal for synchronization adjustment and the phase signal for synchronization adjustment based on the outputs from circuits that process the phase signal and amplitude signal in their respective baseband signal states, and a synchronization adjustment circuit that carries out synchronization adjustment when the high-frequency phase signal and amplitude signal are combined by adjusting delays of the amplitude signal and phase signal based on the detected delay difference.

According to this configuration, the amplitude signal for synchronization adjustment and the phase signal for synchronization adjustment are sent to the transmission lines of the respective signals, these signals are extracted from the outputs of the circuits that process these signals in their respective baseband signal states for synchronization adjustment, and therefore there is no necessity for a demodulation circuit and it is possible to perform synchronization adjustment processing in a simple configuration.

In the one aspect of the polar modulation transmission apparatus of the present invention, the delay difference detection circuit detects a delay difference between the amplitude signal for synchronization adjustment and the phase signal for synchronization adjustment based on the outputs from the final stage circuits that process the phase signal and amplitude signal in their respective baseband signal states.

According to this configuration, a delay difference between the signals is detected by incorporating the amplitude signal for synchronization adjustment and phase signal for synchronization adjustment in their respective baseband signal states, which not only eliminates the necessity of a demodulation circuit and can perform synchronization adjustment processing in a simple configuration but also detects the delay difference based on the outputs from the final stage circuits that process the phase signal and amplitude signal in their respective baseband signal states, and therefore it is possible to substantially prevent an out-of-synchronization state between the signals when the amplitude signal and phase signal are combined.

In the one aspect of the polar modulation transmission apparatus of the present invention, the polar signal generation circuit generates an amplitude signal for synchronization adjustment and a phase signal for synchronization adjustment when a synchronization adjustment request is received on one hand and generates an amplitude signal made up of an amplitude component and a phase signal made up of a phase component from an input transmission baseband modulated signal when there is no synchronization adjustment request on the other.

According to this configuration, the same source (polar signal generation circuit) can be used as the actual source of the polar modulated signal and as the source of the adjustment signal for synchronization, and therefore when synchronization adjustment is carried out using a synchronization adjustment signal, it is possible to reliably prevent an out-of-synchronization state of the actual polar modulated signal at the time of combination.

In the one aspect of the polar modulation transmission apparatus of the present invention, the final stage circuits that process the phase signal and amplitude signal in their respective baseband signal states are made up of low pass filters.

According to this configuration, a delay difference between the signals generated in the low pass filters which are principal delay sources on the respective transmission lines of the amplitude signal and phase signal is eliminated, and therefore it is possible to substantially prevent an out-of-synchronization state between the amplitude signal and phase signal when the signals are combined.

In the one aspect of the polar modulation transmission apparatus of the present invention, the delay difference detection circuit comprises limiter circuits that receive the amplitude signal for synchronization adjustment and the phase signal for synchronization adjustment output from the final stage circuits and a comparison circuit that detects a delay difference by comparing the amplitude signal for synchronization adjustment and the phase signal for synchronization adjustment whose amplitudes are restricted by limiter circuits.

According to this configuration, the magnitudes of the phase signal and amplitude signal input to the comparison circuit can be kept constant irrespective of the input, which improves the detection accuracy of the comparison circuit and thereby improves the synchronization adjustment accuracy.

In the one aspect of the polar modulation transmission apparatus of the present invention, the amplitude signal for synchronization adjustment and phase signal for synchronization adjustment generated in the polar signal generation circuit are signals of mutually opposite phases or in phase.

According to this configuration, it is possible to simplify the configuration of the delay difference detection circuit.

In the one aspect of the polar modulation transmission apparatus of the present invention, the amplitude signal for synchronization adjustment and phase signal for synchronization adjustment generated in the polar signal generation circuit are periodic signals, of the same period, the period becoming shorter gradually or in stages.

According to this configuration, it is possible to start from rough adjustment and perform fine adjustment gradually or in stages, and thereby carry out delay difference detection and synchronization adjustment in a short time and with high accuracy.

The one aspect of the polar modulation transmission apparatus of the present invention further comprises a delay correction control circuit that corrects the delay difference detected by the delay difference detection circuit using a difference between an amount of delay from the output of the final stage circuit that processes the phase signal in a baseband signal state to the output of the combination circuit and an amount of delay from the output of the final stage circuit that processes the amplitude signal in a baseband signal state to the output of the combination circuit as the amount of delay correction and corrects the amount of delay adjustment at the synchronization adjustment circuit.

According to this configuration, even when, for example, another circuit that processes each signal at a radio frequency is disposed between the final stage circuit that processes the signal in a baseband state and the combination circuit, the delay difference caused by this other circuit is stored as the amount of delay correction beforehand, and it is thereby possible to carry out synchronization adjustment with also the delay difference of this other circuit taken into account without providing any demodulation circuit.

In the one aspect of the polar modulation transmission apparatus of the present invention, the final stage circuit that processes the phase signal in a baseband signal state is a low pass filter of a PLL circuit and further comprises a delay correction control circuit that corrects the delay difference detected by the delay difference detection circuit using the amount of delay generated at the voltage control oscillator provided after the PLL circuit as the amount of delay correction and corrects the amount of delay adjustment at the synchronization adjustment circuit.

According to this configuration, it is possible to perform synchronization adjustment with also the delay difference generated in the voltage control oscillator taken into account by only storing the delay difference produced in the voltage control oscillator as the amount of delay correction beforehand without providing any demodulation circuit.

A radio communication apparatus according to the present invention comprises any one of the above described polar modulation transmission apparatuses.

According to this configuration, it is possible to form a polar modulated signal with an out-of-synchronization state between the phase signal and amplitude signal suppressed and thereby realize a radio communication apparatus capable of carrying out transmission of high quality. For example, when the radio communication apparatus is a cellular phone set, it is possible to transmit a high quality speech signal and data with an improved error rate characteristic.

The synchronization method for a polar modulation transmission apparatus according to the present invention comprises the steps of transmitting an amplitude signal for synchronization adjustment and a phase signal for synchronization adjustment to an amplitude signal transmission line and a phase signal transmission line of the polar modulation transmission apparatus respectively, incorporating the transmitted amplitude signal for synchronization adjustment and phase signal for synchronization adjustment from final stage circuits that process the signals in their respective baseband signal states, detecting a delay difference between the amplitude signal for synchronization adjustment and phase signal for synchronization adjustment incorporated, adjusting the delays of the amplitude signal and phase signal based on the detected delay difference and thereby performing synchronization adjustment when the phase signal and amplitude signal are combined.

According to this method, it is possible to substantially prevent an out-of-synchronization state between the amplitude signal and phase signal when the signals are combined in a simple configuration.

The present invention is not limited to the above described embodiments, and various variations and modifications may be possible without departing from the scope of the present invention.

This application is based on the Japanese Patent Application No. 2004-59500 filed on Mar. 3, 2004, entire content of which is expressly incorporated by reference herein.

What is claimed is:

1. A polar modulation transmission apparatus comprising:
   a polar signal generation circuit that generates an amplitude signal for synchronization adjustment and a phase signal for synchronization adjustment;
   a high-frequency phase modulated signal formation circuit that forms a high-frequency phase modulated signal by modulating a carrier frequency signal with said phase signal;
   a combination circuit that combines said amplitude signal and said phase signal by making variable the amplitude of said high-frequency phase modulated signal according to said amplitude signal;
   a delay difference detection circuit that detects a delay difference between said amplitude signal for synchronization adjustment and said phase signal for synchronization adjustment based on the outputs from circuits that process said phase signal and said amplitude signal in their respective baseband signal states; and
   a synchronization adjustment circuit that carries out synchronization adjustment when said high-frequency phase signal and said amplitude signal are combined by adjusting delays of said amplitude signal and said phase signal based on said detected delay difference.

2. The polar modulation transmission apparatus according to claim 1, wherein said delay difference detection circuit detects a delay difference between said amplitude signal for synchronization adjustment and said phase signal for synchronization adjustment based on the outputs from the final stage circuits that process said phase signal and said amplitude signal in their respective baseband signal states.

3. The polar modulation transmission apparatus according to claim 1, wherein said polar signal generation circuit generates said amplitude signal for synchronization adjustment and said phase signal for synchronization adjustment when a synchronization adjustment request is received on one hand and generates an amplitude signal made up of an amplitude component and a phase signal made up of a phase component from an input transmission baseband modulated signal when there is no synchronization adjustment request on the other.

4. The polar modulation transmission apparatus according to claim 2, wherein said final stage circuits are made up of low pass filters.

5. The polar modulation transmission apparatus according to claim 1, wherein said delay difference detection circuit comprises:
   limiter circuits that receive said amplitude signal for synchronization adjustment and said phase signal for synchronization adjustment output from the circuits that process said phase signal and said amplitude signal in their respective baseband states; and
   a comparison circuit that detects a delay difference by comparing said amplitude signal for synchronization adjustment and said phase signal for synchronization adjustment whose amplitudes are restricted by said limiter circuits.

6. The polar modulation transmission apparatus according to claim 1, wherein said amplitude signal for synchronization adjustment and said phase signal for synchronization adjustment generated in said polar signal generation circuit are signals of mutually opposite phases or in phase.

7. The polar modulation transmission apparatus according to claim 1, wherein said amplitude signal for synchronization adjustment and said phase signal for synchronization adjustment generated in said polar signal generation circuit are periodic signals, of the same period, said period becoming shorter gradually or in stages.

8. The polar modulation transmission apparatus according to claim 2, further comprising a delay correction control circuit that corrects the delay difference detected by said delay difference detection circuit using a difference between an amount of delay from the output of the final stage circuit that processes said phase signal in a baseband signal state to the output of said combination circuit and an amount of delay from the output of the final stage circuit that processes said amplitude signal in a baseband signal state to the output of said combination circuit as the amount of delay correction and corrects the amount of delay adjustment at said synchronization adjustment circuit.

9. The polar modulation transmission apparatus according to claim 2, wherein the final stage circuit that processes said phase signal in a baseband signal state is a low pass filter of a PLL circuit, and
   further comprises a delay correction control circuit that corrects the delay difference detected by said delay difference detection circuit using the amount of delay generated at the voltage control oscillator provided after said PLL circuit as the amount of delay correction and corrects the amount of delay adjustment at said synchronization adjustment circuit.

10. A radio communication apparatus comprising the polar modulation transmission apparatus according to claim 1.

11. A synchronization method for a polar modulation transmission apparatus, comprising the steps of:
transmitting an amplitude signal for synchronization adjustment and a phase signal for synchronization adjustment to an amplitude signal transmission line and a phase signal transmission line of the polar modulation transmission apparatus respectively,
incorporating the transmitted amplitude signal for synchronization adjustment and phase signal for synchronization adjustment from final stage circuits that process the signals in their respective baseband signal states,
detecting a delay difference between said amplitude signal for synchronization adjustment and said phase signal for synchronization adjustment incorporated,
adjusting the delays of said amplitude signal and said phase signal based on said delay difference detected, and
thereby performing synchronization adjustment when said phase signal and said amplitude signal are combined.

* * * * *